US012666799B2

(12) United States Patent
Kim et al.

(10) Patent No.: US 12,666,799 B2
(45) Date of Patent: Jun. 23, 2026

(54) ORGANIC LIGHT EMITTING DISPLAY PANEL AND METHOD OF MANUFACTURING THE SAME

(71) Applicant: LG Display Co., Ltd., Seoul (KR)

(72) Inventors: Kang Hyun Kim, Paju-si (KR); Se Jin Kim, Paju-si (KR); Hee Tae Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 545 days.

(21) Appl. No.: 17/974,214

(22) Filed: Oct. 26, 2022

(65) Prior Publication Data

US 2023/0209951 A1     Jun. 29, 2023

(30) Foreign Application Priority Data

Dec. 29, 2021     (KR) ......................... 10-2021-0191875

(51) Int. Cl.
H01L 27/32          (2006.01)
H01L 51/00          (2006.01)
(Continued)

(52) U.S. Cl.
CPC ........... H10K 59/122 (2023.02); H10K 50/19 (2023.02); H10K 50/852 (2023.02); H10K 59/32 (2023.02);
(Continued)

(58) Field of Classification Search
CPC ................................................... H10K 59/122
See application file for complete search history.

(56) References Cited

U.S. PATENT DOCUMENTS 7,285,910 B2 *  10/2007  Park ..................... H10K 71/135
                                                       428/917
8,389,323 B2 *  3/2013  Choi ..................... H01L 21/268
                                                       438/82
(Continued)

FOREIGN PATENT DOCUMENTS

CN          107123752 A  *  9/2017  ............... H10K 1/00
JP          2011-49545 A     3/2011
(Continued)

OTHER PUBLICATIONS

Machine translation, Song, Chinese Pat. Pub. No. CN107123752A, translation date: Oct. 7, 2025, Clarivate Analytics, all pages. (Year: 2025).*
(Continued)

*Primary Examiner* — Victoria K. Hall
(74) *Attorney, Agent, or Firm* — Birch, Stewart, Kolasch & Birch, LLP

(57)          ABSTRACT
Discussed is a method of manufacturing an organic light emitting display panel for simplifying a manufacturing process and enhancing display quality. The organic light emitting display panel can include a first electrode disposed in each of subpixel areas of a substrate, bank layers disposed on the substrate at a boundary portion between adjacent subpixel areas, a lateral surface of the bank layers being hydrophilic, a first organic material layer disposed on the bank layers and the first electrode, a surface of the first organic material layer on the bank layers being hydrophobic, a second organic material layer disposed on the first organic material layer between adjacent bank layers, a third organic material layer disposed on the second organic material layer and the first organic material layer, and a second electrode disposed on the third organic material layer.

7 Claims, 34 Drawing Sheets

(51) Int. Cl.

| | |
|---|---|
| *H01L 51/52* | (2006.01) |
| *H01L 51/56* | (2006.01) |
| *H10K 50/19* | (2023.01) |
| *H10K 50/852* | (2023.01) |
| *H10K 59/122* | (2023.01) |
| *H10K 59/32* | (2023.01) |
| *H10K 59/80* | (2023.01) |
| *H10K 71/00* | (2023.01) |
| *H10K 71/13* | (2023.01) |
| *H10K 71/16* | (2023.01) |
| *H10K 71/60* | (2023.01) |
| *H10K 50/15* | (2023.01) |
| *H10K 50/17* | (2023.01) |
| *H10K 50/84* | (2023.01) |
| *H10K 59/12* | (2023.01) |
| *H10K 59/35* | (2023.01) |
| *H10K 102/00* | (2023.01) |

(52) U.S. Cl.

CPC ........... *H10K 59/876* (2023.02); *H10K 71/00* (2023.02); *H10K 71/135* (2023.02); *H10K 71/16* (2023.02); *H10K 71/60* (2023.02); *H10K 50/15* (2023.02); *H10K 50/17* (2023.02); *H10K 50/846* (2023.02); *H10K 59/1201* (2023.02); *H10K 59/352* (2023.02); *H10K 59/353* (2023.02); *H10K 2102/351* (2023.02)

(56) References Cited

U.S. PATENT DOCUMENTS

| | | | | | |
|---|---|---|---|---|---|
| 9,024,307 | B2 * | 5/2015 | Lee | ...................... | H10K 50/824 |
| | | | | | 257/E51.001 |
| 9,349,957 | B2 * | 5/2016 | Shin | ..................... | H10K 59/122 |
| 9,419,062 | B2 * | 8/2016 | Park | ...................... | H10K 50/11 |
| 9,450,211 | B2 * | 9/2016 | Ahn | ..................... | H10K 59/173 |
| 2003/0222267 | A1 * | 12/2003 | Kim | ..................... | H10K 59/173 |
| | | | | | 257/98 |
| 2005/0200273 | A1 * | 9/2005 | Nozawa | ................. | H10K 50/82 |
| | | | | | 313/506 |
| 2005/0266763 | A1 * | 12/2005 | Kimura | .................. | H10K 71/40 |
| | | | | | 445/24 |
| 2006/0267489 | A1 * | 11/2006 | Saafir | ................... | H10K 59/122 |
| | | | | | 313/506 |
| 2010/0181559 | A1 * | 7/2010 | Nakatani | .............. | H10K 59/122 |
| | | | | | 438/34 |
| 2010/0289728 | A1 * | 11/2010 | Nakatani | ................ | H10K 71/12 |
| | | | | | 345/76 |
| 2011/0108880 | A1 * | 5/2011 | Yanagihara | .......... | H10K 59/122 |
| | | | | | 438/26 |
| 2011/0127507 | A1 * | 6/2011 | Choi | ..................... | H01L 21/268 |
| | | | | | 438/34 |
| 2011/0198598 | A1 * | 8/2011 | Kim | ..................... | H10K 59/122 |
| | | | | | 438/34 |
| 2012/0319089 | A1 * | 12/2012 | Shin | ........................ | H10K 71/00 |
| | | | | | 257/E51.024 |
| 2013/0099659 | A1 * | 4/2013 | Park | ..................... | H10K 59/122 |
| | | | | | 313/504 |
| 2014/0091285 | A1 * | 4/2014 | Shin | ........................ | H10K 71/13 |
| | | | | | 438/34 |
| 2015/0008398 | A1 * | 1/2015 | Lee | .................. | H10K 59/80522 |
| | | | | | 438/35 |
| 2015/0115233 | A1 * | 4/2015 | Kim | ...................... | H10K 50/15 |
| | | | | | 257/40 |
| 2016/0248035 | A1 * | 8/2016 | Hwang | ................ | H10K 59/122 |
| 2016/0343940 | A1 * | 11/2016 | Kong | .................. | H10K 71/135 |
| 2017/0133442 | A1 * | 5/2017 | Hosono | ............... | H10K 59/122 |
| 2019/0280059 | A1 * | 9/2019 | Tang | .................. | H10K 50/824 |
| 2020/0066815 | A1 * | 2/2020 | Choi | ................... | H10K 59/173 |
| 2021/0057498 | A1 * | 2/2021 | Pahk | .................. | H10K 59/122 |
| 2023/0044202 | A1 * | 2/2023 | Kim | ..................... | H10K 50/844 |

FOREIGN PATENT DOCUMENTS

| | | |
|---|---|---|
| JP | 2011-191730 A | 9/2011 |
| KR | 10-2011-0027612 A | 3/2011 |
| KR | 10-2012-0052948 A | 5/2012 |
| KR | 10-2015-0079035 A | 7/2015 |

OTHER PUBLICATIONS

Japan Patent Office, Decision to Grant a Patent, Japanese Patent Application No. 2022-171890, Jul. 30, 2024, all pages. (Year: 2024).*

Japan Patent Office, Notice of Reasons for Refusal, Japanese Patent Application No. 2022-171890, May 7, 2024, all pages. (Year: 2024).*

Japan Patent Office, Notice of Reasons for Refusal, Japanese Patent Application No. 2022-171890, Dec. 19, 2023, all pages. (Year: 2023).*

Japan Patent Office, Notice of Reasons for Refusal, Japanese Patent Application No. 2022-171890, Aug. 13, 2023, all pages. (Year: 2023).*

Korean Intellectual Property Office, Request for the Submission of an Opinion, Korean Patent Application No. 10-2021-0191875, Oct. 16, 2025, all pages. (Year: 2025).*

Korean Intellectual Property Office, Written Opinion, Korean Patent Application No. 10-2021-0191875, Jan. 14, 2026, all pages. (Year: 2026).*

* cited by examiner

| | |
|---|---|
| SECOND ELECTRODE | |
| EIL | DEPOSITION |
| ETL | |
| EML | SOLUBLE |
| CF4 OR SF6 PLASMA TREATMENT | |
| HTL | DEPOSITION |
| HIL | |
| FIRST ELECTRODE | ITO |

FIG. 8

| SECOND ELECTRODE | DEPOSITION |
| --- | --- |
| EIL | |
| ETL | |
| EML | SOLUBLE |
| HTL2 | |
| CF4 OR SE6 PLASMA TREATMENT | |
| HTL1 | DEPOSITION |
| HIL | |
| FIRST ELECTRODE | ITO |

| SECOND ELECTRODE | |
|---|---|
| EIL | DEPOSITION |
| ETL2 | |
| EML2 | SOLUBLE |
| HTL2 | |
| CF4 OR SF6 PLASMA TREATMENT | |
| HIL | |
| p-CGL | DEPOSITION |
| n-CGL | |
| ETL1 | |
| EML1 | SOLUBLE |
| HTL1 | |
| FIRST ELECTRODE | ITO |

Stack2 brackets rows: SECOND ELECTRODE through HIL.
Stack1 brackets rows: ETL1 through HTL1.

FIG. 17

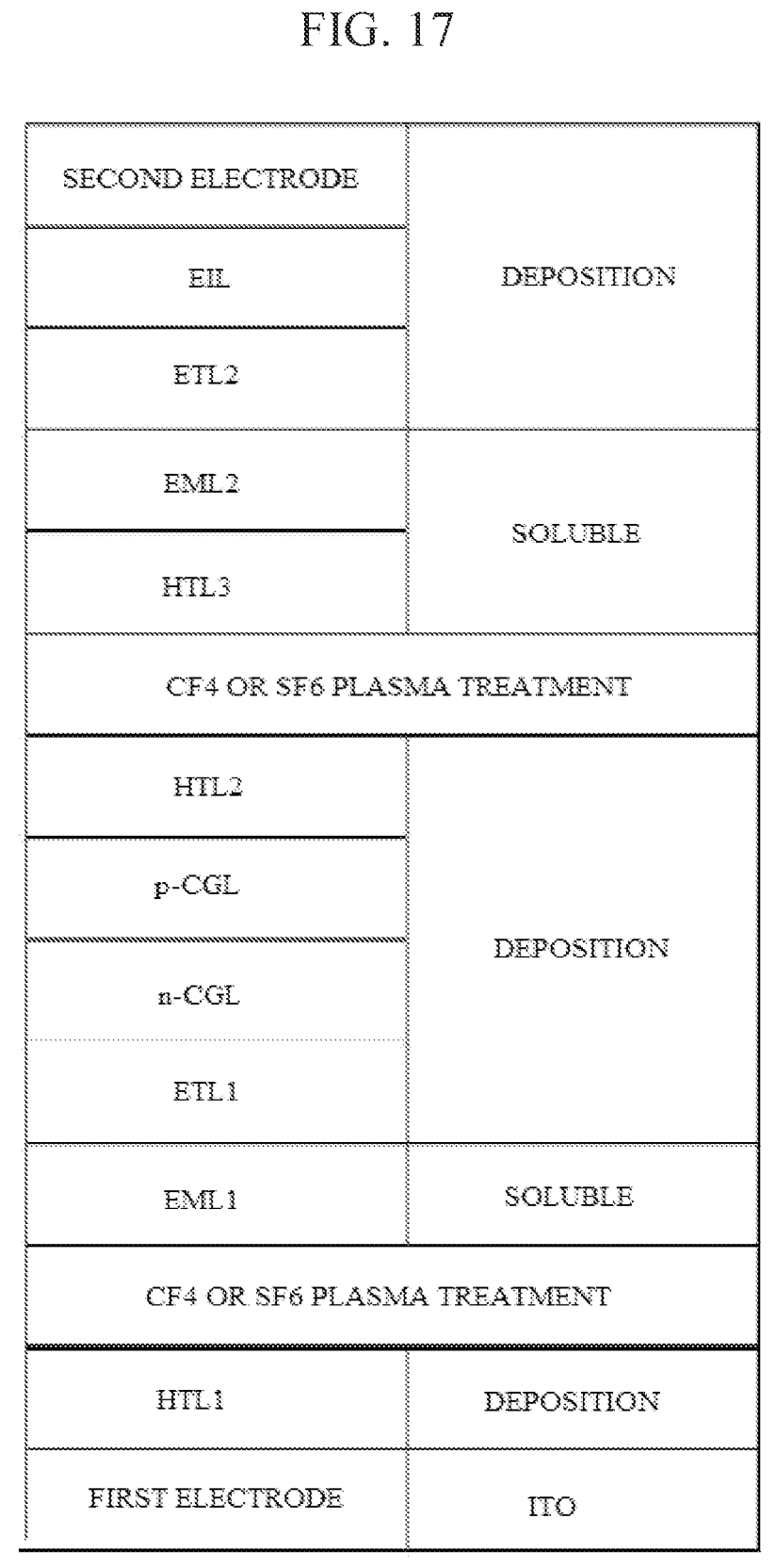

| | |
|---|---|
| SECOND ELECTRODE | |
| EIL | DEPOSITION |
| ETL2 | |
| EML2 | SOLUBLE |
| HTL3 | |
| CF4 OR SF6 PLASMA TREATMENT | |
| HTL2 | |
| p-CGL | DEPOSITION |
| n-CGL | |
| ETL1 | |
| EML1 | SOLUBLE |
| CF4 OR SF6 PLASMA TREATMENT | |
| HTL1 | DEPOSITION |
| FIRST ELECTRODE | ITO |

ORGANIC LIGHT EMITTING DISPLAY PANEL AND METHOD OF MANUFACTURING THE SAME

CROSS-REFERENCE TO RELATED APPLICATIONS

This application claims priority to the Korean Patent Application No. 10-2021-0191875 filed in the Republic of Korea on Dec. 29, 2021, the entire contents of which are hereby expressly incorporated by reference into the present application.

BACKGROUND OF THE DISCLOSURE

Field

The present disclosure relates to an organic light emitting display panel and a method of manufacturing the same, and more particularly, to an organic light emitting display panel and a method of manufacturing the same, which can enhance display quality.

Discussion of the Related Art

An organic light emitting display apparatus include an organic light emitting display panel which includes data lines, scan lines, and subpixels respectively formed at the intersection areas between the data lines and the gate lines, a gate driving circuit which supplies scan signals to the scan lines, and a data driving circuit which supplies data voltages to the data lines.

Each of the subpixels of the organic light emitting display panel includes an organic light emitting diode (hereinafter referred to as an OLED) and a pixel circuit which independently drives the OLED.

The OLED includes a plurality of organic compound layers between an anode electrode and a cathode thereof, and the plurality of organic compound layers can be manufactured by an inkjet printing process.

For example, a first electrode of a light emitting device can be formed in each subpixel area.

Moreover, a first bank material having hydrophilicity is coated, and then, by patterning the first bank material, a first bank is formed at a boundary portion of each subpixel area.

A second bank material having hydrophobicity is formed on the first bank, and then, the plurality of organic compound layers are formed on the first electrode by the inkjet printing process.

However, in forming the first and second banks as described above, since an organic residual layer is on the first electrode, a characteristic of an OLED can be reduced. Further, as an ultraviolet (UV) or plasma treatment can be performed for removing the organic residual layer, a hydrophobic characteristic of the second bank can be reduced, which can make it difficult to perform the inkjet printing process.

SUMMARY OF THE DISCLOSURE

To overcome or address the aforementioned problems and limitations of the related art, the present disclosure can provide an organic light emitting display panel and a method of manufacturing the same, in which a manufacturing process is simplified and display quality is enhanced.

To achieve these objects and other advantages and in accordance with the purpose of the disclosure, as embodied and broadly described herein, an organic light emitting display panel can include a first electrode disposed in each of a plurality of subpixel areas of a substrate, a bank layer disposed on the substrate at a boundary portion between adjacent subpixel areas, a lateral surface of the bank layer being hydrophilic, a first organic material layer disposed on the bank layer and the first electrode, a surface of the first organic material layer on the bank layer being hydrophobic, a second organic material layer disposed on the first organic material layer between adjacent bank layers, a third organic material layer disposed on the second organic material layer and the first organic material layer, and a second electrode disposed on the third organic material layer. The first organic material layer can include at least one of a hole injection layer and a hole transport layer, the second organic material layer can include an emission layer, and the third organic material layer can include at least one of an electron transport layer and an electron injection layer.

Here, in order to improve pile-up or stacking, the plurality of subpixel areas include red, green, and blue subpixel areas, and the second organic material layer can include a first hole transport layer disposed on only the first organic material layer of the red subpixel area and the green subpixel area between adjacent bank layers, and an emission layer disposed in the red subpixel area, the green subpixel area, and the red subpixel area.

An organic light emitting display panel according to an embodiment of the present disclosure can include a first electrode disposed in each of a plurality of subpixel areas of a substrate where the plurality of subpixel areas including red, green, and blue subpixel areas are defined, a bank layer disposed in the substrate on a boundary portion between adjacent subpixel areas, a lateral surface of the bank layer being hydrophilic, a first organic material layer disposed on the first electrode between adjacent bank layers, a second organic material layer disposed on a top surface and a lateral surface of the bank layer and the first organic material layer, a surface of the second organic material layer on the bank layer being hydrophobic, a third organic material layer disposed on the second organic material layer between adjacent bank layers, a fourth organic material layer disposed on the second organic material layer and the third organic material layer, and a second electrode disposed on the fourth organic material layer. The first organic material layer can include a first hole transport layer and a first emission layer, the second organic material layer can include a first electron transport layer, an n-type charge generating layer, a p-type charge generating layer, and a hole injection layer, the third organic material layer can include a second hole transport layer and a second emission layer, and the fourth organic material layer can include a second electron transport layer and an electron injection layer.

In order to improve pile-up, an organic light emitting display panel according to an embodiment of the present disclosure can include a first electrode disposed in each of a plurality of subpixel areas of a substrate where the plurality of subpixel areas including red, green, and blue subpixel areas are defined, a bank layer disposed on the substrate at a boundary portion between adjacent subpixel areas, a lateral surface of the bank layer being hydrophilic, a first organic material layer disposed on the first electrode of each subpixel area between adjacent bank layers, a second organic material layer disposed on the first organic material layer and the bank layer, a lateral surface of the second organic material layer on the bank layer being hydrophilic, a third organic material layer disposed on the second organic material layer between adjacent bank layers, a fourth organic material layer disposed on the third organic material layer and the second organic material layer, and a second electrode disposed on the fourth organic material layer. The third organic material layer can include a first hole transport layer disposed on only the second organic material layer of the red subpixel area and the green subpixel area between adjacent bank layers, and a first emission layer disposed in the red subpixel area, the green subpixel area, and the blue subpixel area.

An organic light emitting display panel according to an embodiment of the present disclosure can include a first electrode disposed in each of a plurality of subpixel areas of a substrate where the plurality of subpixel areas including red, green, and blue subpixel areas are defined, a bank layer disposed on the substrate at a boundary portion between adjacent subpixel areas, a lateral surface of the bank layer being hydrophilic, a first organic material layer disposed on the bank layer and the first electrode, a surface of the first organic material layer on the bank layer being hydrophobic, a second organic material layer disposed on the first organic material layer of each subpixel area between adjacent bank layers, a third organic material layer disposed on the second organic material layer and the first organic material layer, a surface of the third organic material layer on the bank layer being hydrophobic, a fourth organic material layer disposed on the third organic material layer between adjacent bank layers, a fifth organic material layer disposed on the fourth organic material layer and the third organic material layer, and a second electrode disposed on the fifth organic material layer. The fourth organic material layer can include a first hole transport layer disposed on only the third organic material layer of the red subpixel area and the green subpixel area between adjacent bank layers, and a first emission layer disposed in the red subpixel area, the green subpixel area, and the blue subpixel area.

A method of manufacturing an organic light emitting display panel according to an embodiment of the present disclosure can include forming a first electrode in each of a plurality of subpixel areas of a substrate, forming a bank layer at a boundary portion between adjacent subpixel areas on the substrate, performing a first plasma treatment on a lateral surface of the bank layer and an upper portion of the first electrode to remove an organic residual layer on each first electrode of each subpixel area and to make the lateral surface of the bank layer hydrophilic, forming a first organic material layer on the first electrode and the bank layer through a deposition process, performing a second plasma treatment to allow a top surface of the first organic material layer on the bank layer to be hydrophobic, forming a second organic material layer on the first organic material layer of each subpixel area through an inkjet printing process, and forming a third organic material layer and a second electrode on the first organic material layer and the second organic material layer through a deposition process. The first organic material layer can include at least one of a hole injection layer and a hole transport layer, the second organic material layer can include an emission layer, and the third organic material layer can include at least one of an electron transport layer and an electron injection layer.

In order to improve pile-up, the plurality of subpixel areas include red, green, and blue subpixel areas, and the forming of the second organic material layer can include forming a second hole transport layer on only the first organic material layer of the red subpixel area and the green subpixel area between adjacent bank layers and forming an emission layer in each of the red subpixel area, the green subpixel area, and the blue subpixel area.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 8 is a structure diagram illustrating a process performed on each layer for removing a pile-up effect in a light emitting device having a single stack structure according to a second embodiment of the present disclosure;

FIG. 17 is a structure diagram illustrating a process performed on each layer and a light emitting device having a multi-stack structure according to a fifth embodiment of the present disclosure;

DETAILED DESCRIPTION OF THE EMBODIMENTS

Figure 1:
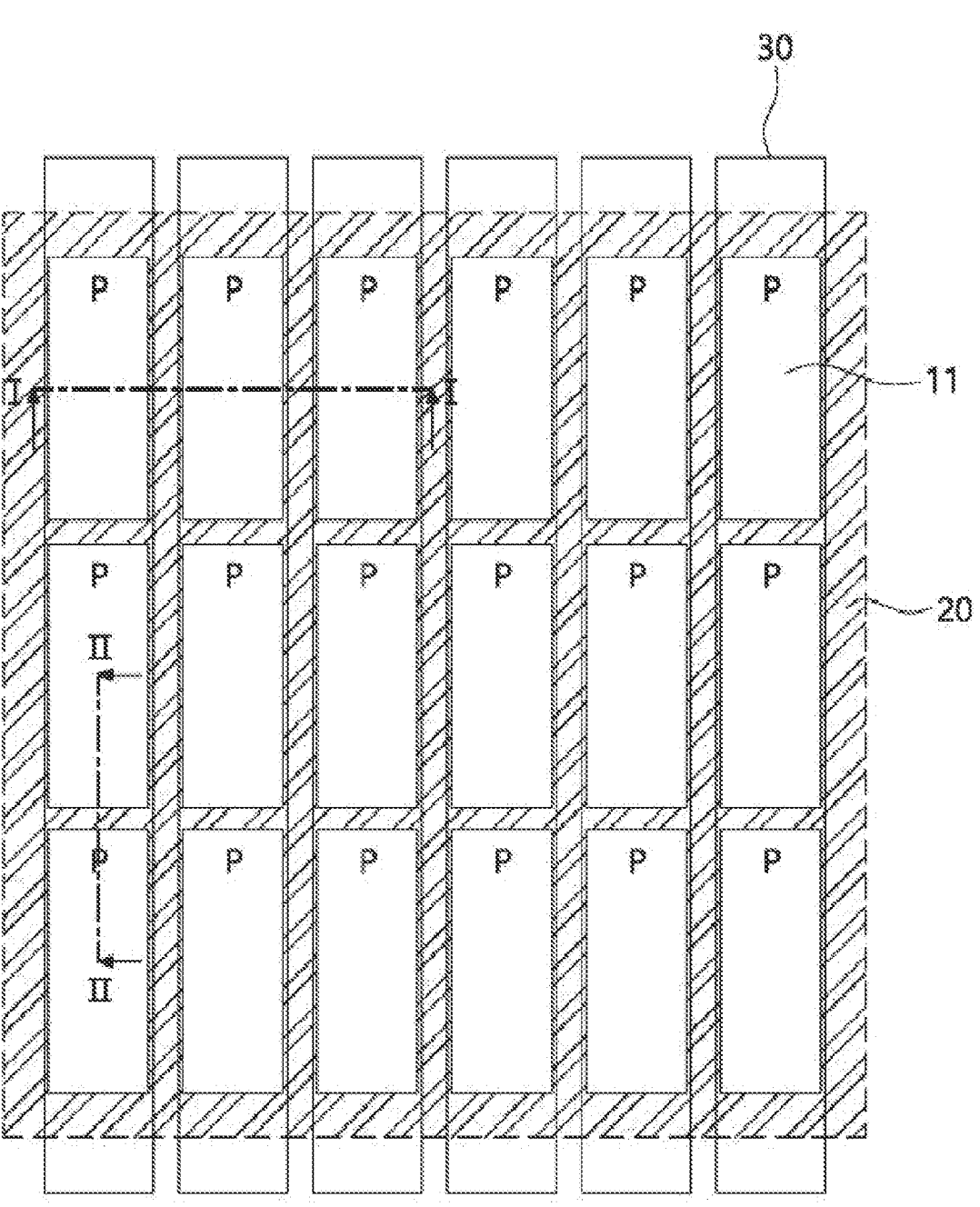
FIG. 1 is a plan view of subpixels of an organic light emitting display panel according to an embodiment of the present disclosure.

Hereinafter, an organic light emitting display panel according to an embodiment of the present disclosure will be described in detail with reference to the accompanying drawings. All the components of each display panel according to all embodiments of the present disclosure are operatively coupled and configured.

Herein, like reference numerals refer to like elements.

FIG. 1 is a plan view of subpixels of an organic light emitting display panel according to an embodiments of the present disclosure.

As illustrated in FIG. 1, the organic light emitting display panel according to the present disclosure can include a plurality of subpixel areas P, a first electrode 11 which is disposed in each of the subpixel areas P, and a bank layer 20 which surrounds each subpixel area P and has a lattice form.

The plurality of subpixels can include a red subpixel which includes an organic light emitting diode (OLED) emitting red light, a green subpixel which includes an OLED emitting green light, and a blue subpixel which includes an OLED emitting blue light.

A structure of an organic light emitting display panel and a method of manufacturing the organic light emitting display panel according to a first embodiment of the present disclosure will be described below.

Figures 2, 3:
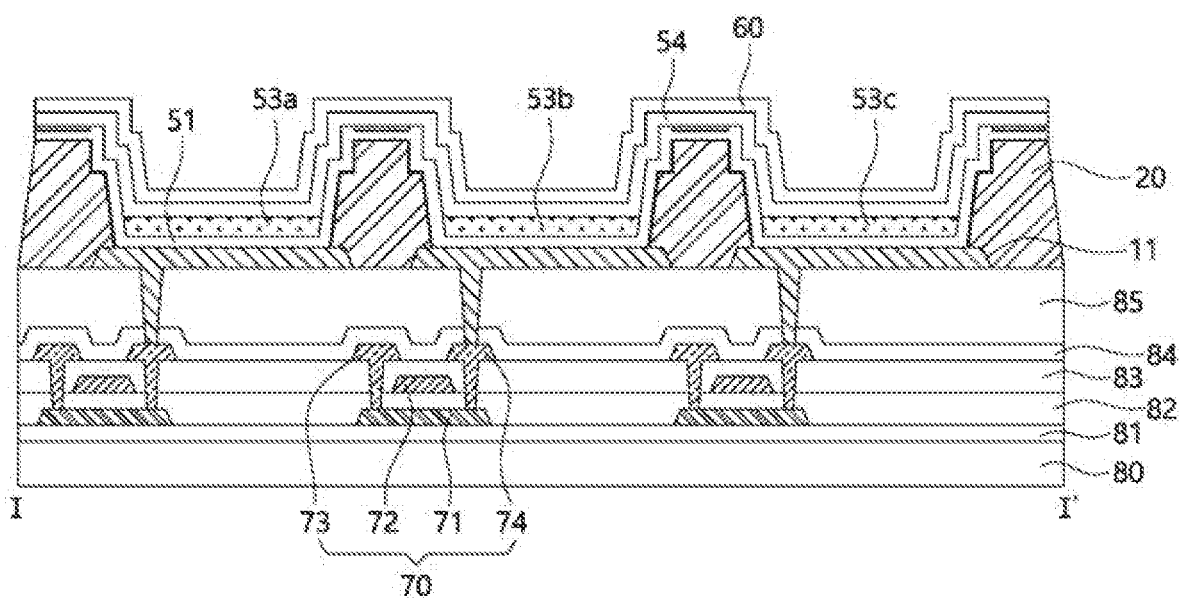
FIG. 2 is a structure diagram illustrating a process performed on each layer and an organic light emitting device having a single stack structure according to a first embodiment of the present disclosure.
FIG. 3 is a structure cross-sectional view of an organic light emitting device according to the first embodiment of the present disclosure.

FIG. 2 is a structure diagram illustrating a process performed on each layer and an organic light emitting device having a single stack structure according to the first embodiment of the present disclosure.

The light emitting device according to the first embodiment of the present disclosure, as illustrated in FIG. 2, can have a single stack structure where a hole injection layer (HIL), a hole transport layer (HTL), an emission layer (EML), an electron transport layer (ETL), and an electron injection layer (EIL) are sequentially stacked between a first electrode (Anode; ITO) and a second electrode (Cathode; Metal). Here, the hole injection layer need not be provided.

Here, the hole injection layer (HIL) and the hole transport layer (HTL) can be formed by a deposition process, the emission layer (EML) can be formed by an inkjet printing process (a soluble process), and the electron transport layer (ETL), the electron injection layer (EIL), and the second electrode can be formed by a deposition process. In embodiments of the present invention, layers formed by the inkjet process or the soluble process can be referred to as one or more soluble layers, and layers formed by the deposition process can be referred to as one or more deposition layers.

FIG. 3 is a structure cross-sectional view of an organic light emitting device according to a first embodiment of the present disclosure.

The organic light emitting device according to the first embodiment of the present disclosure, as illustrated in FIG. 3, can include a thin film transistor (TFT) 70 and an organic light emitting device, which are provided in each of a plurality of subpixel areas P on a substrate 80.

The substrate 80 can include an insulating material, and for example, the substrate 80 can include glass or a plastic material such as polyimide (PI).

A buffer layer 81 can be disposed on the substrate 80. The buffer layer 81 can include a single layer, including nitride silicon (SiNx) or oxide silicon (SiOx) which is an inorganic material, or a multilayer including SiNx and SiOx. However, the buffer layer 81 need not be an essential element and can be omitted based on the kind and material of the substrate 80 and a structure and a type of the TFT 70.

The TFT 70 can be disposed on the buffer layer 81. The TFT 70 can include an active layer 71, a gate electrode 72, a source electrode 73, and a drain electrode 74.

The active layer 71 of the TFT 70 can be disposed on the buffer layer 81, and a gate insulation layer 82 can be disposed on the active layer 71 and the buffer layer 81.

The active layer 71 can include amorphous silicon (a-Si), polycrystalline silicon (poly-Si), an oxide semiconductor, or an organic semiconductor.

The gate insulation layer 82 can include a single layer, including SiNx or SiOx which is an inorganic material, or a multilayer including SiNx and SiOx, but is not limited thereto.

A first contact hole, through which each of the source electrode 73 and the drain electrode 74 contacts the active layer 71, can be formed in the gate insulation layer 82.

The gate electrode 72 can be disposed on the gate insulation layer 82 to overlap the active layer 71. The gate electrode 72 can include conductive metal (for example, copper (Cu), aluminum (Al), molybdenum (Mo), or an alloy thereof), but is not limited thereto.

An interlayer insulation layer 83 can be disposed on the gate electrode 72 and the gate insulation layer 82. The interlayer insulation layer 83 can include a single layer, including SiNx or SiOx which is an inorganic material, or a multilayer including SiNx and SiOx, but is not limited thereto. A second contact hole, through which each of the source electrode 73 and the drain electrode 74 contacts the active layer 71, can be formed in the interlayer insulation layer 83.

The source electrode 73 and the drain electrode 74 can be disposed on the interlayer insulation layer 83. The source electrode 73 and the drain electrode 74 can include conductive metal (for example, Cu, Al, Mo, or an alloy thereof), but are not limited thereto. Each of the source electrode 73 and the drain electrode 74 can be electrically connected to the active layer 71 through the first contact hole and the second contact hole.

A passivation layer 84 can be disposed on the TFT 70 and the interlayer insulation layer 83. The passivation layer 84 can include a single layer, including SiNx or SiOx which is an inorganic material, or a multilayer including SiNx and SiOx, but is not limited thereto.

A third contact hole for enabling a first electrode 11 of an OLED to be connected to the drain electrode 74 of the TFT 70 can be formed in the passivation layer 84. The passivation layer 84 need not be an essential element and can be omitted based on a design of the organic light emitting display panel.

A planarization layer 85 can be disposed on the passivation layer 84. The planarization layer 85 can include an organic material, and a fourth contact hole for exposing the drain electrode 74 of the TFT 70 can be formed in the planarization layer 85.

The first electrode 11 of the OLED can be disposed in each subpixel area on the planarization layer 85, and the bank layer 20 can be disposed on the passivation layer 84 at a boundary portion between the subpixel areas P to overlap an edge of the first electrode 11.

An edge and a lateral surface of a top surface of the bank layer 20 in a vertical direction (a first direction) can be hydrophilic, and the top surface and the lateral surface of the bank layer 20 adjacent to each subpixel area in a horizontal direction (a second direction) can be hydrophilic. In embodiments of the present disclosure, references to a vertical direction (or a first direction) can refer to a vertical direction in a plan view of FIG. 1, and references to a horizontal direction (or a second direction) can refer to a horizontal direction in the plan view of FIG. 1, but such is not required as long as the first direction and the second direction intersect.

A first organic material layer 51 can be formed on the top surface and the lateral surface of the bank layer 20 and an upper side of the first electrode 11, and the first organic material layer 51 on the bank layer 20 can be, or become, hydrophobic optionally.

A plurality of second organic material layers 53a to 53c can be disposed on the first organic material layer 51 between adjacent bank layers 20, and a third organic material layer 54 can be disposed on the second organic material layers 53a to 53c and the first organic material layer 51 over the bank layer 20.

Moreover, the second electrode 60 can be disposed on the third organic material layer 54.

Here, the first organic material layer can include a hole injection layer (HIL) and a hole transport layer (HTL), the second organic material layer can include an emission layer (EML), and the third organic material layer can include an electron transport layer (ETL) and an electron injection layer (EIL).

FIG. 3 is a structure cross-sectional view of an organic light emitting device according to the first embodiment of the present disclosure.

Figure 4A:
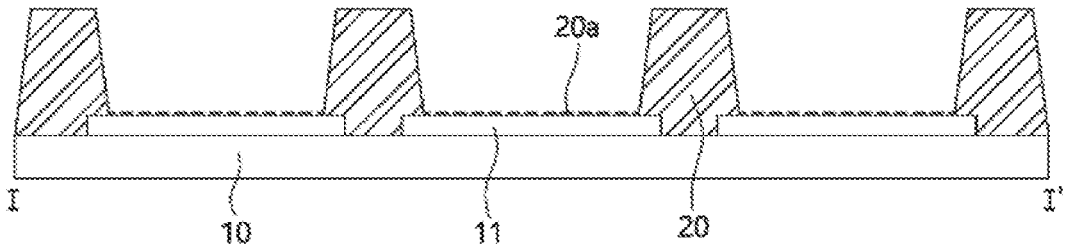
FIGS. 4A to 4G are process cross-sectional views of an organic light emitting display panel taken along line I-I' of FIG. 1 according to the first embodiment of the present disclosure.
Figure 4B:
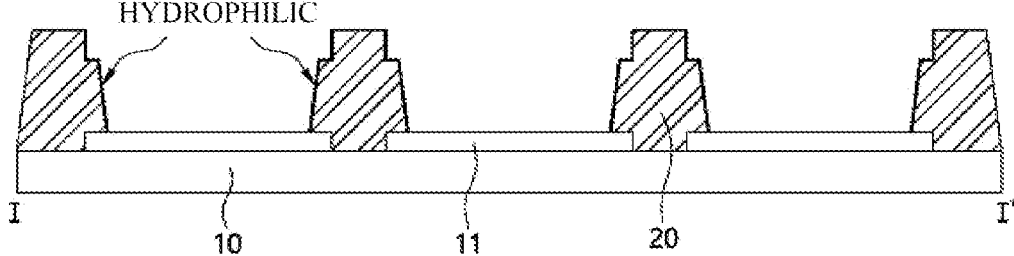
Figure 4C:
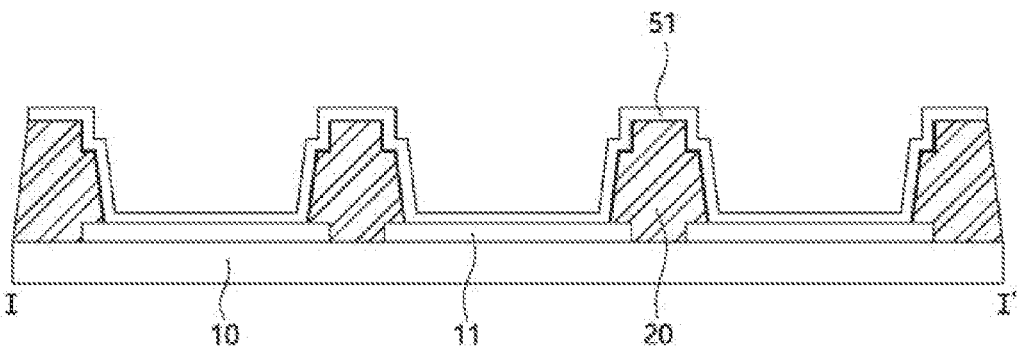
Figure 4D:
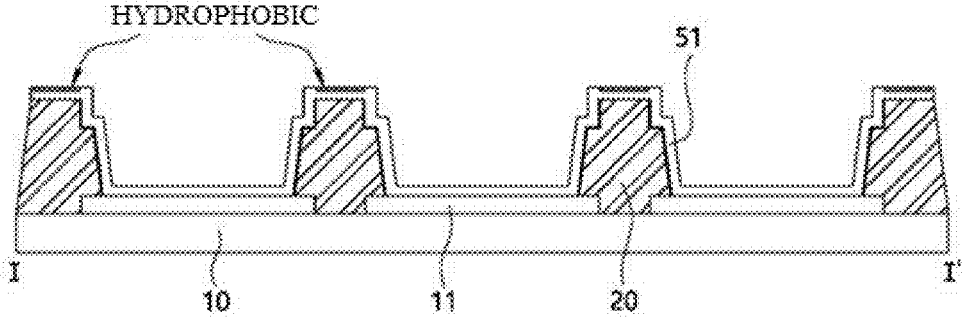
Figure 4E:
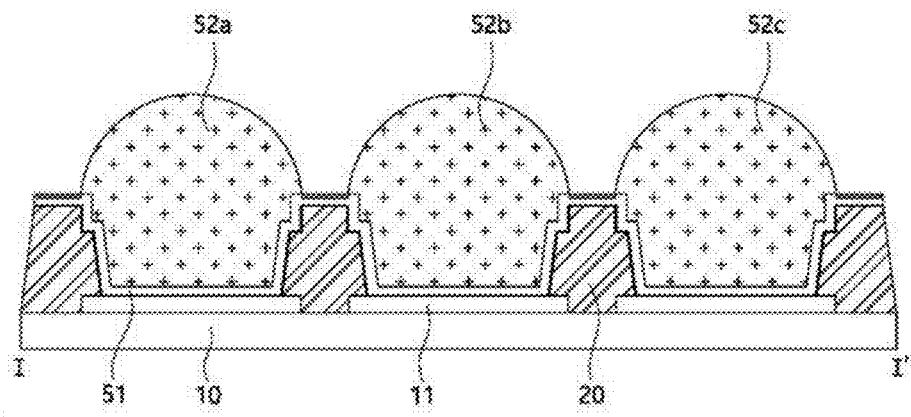
Figure 4F:
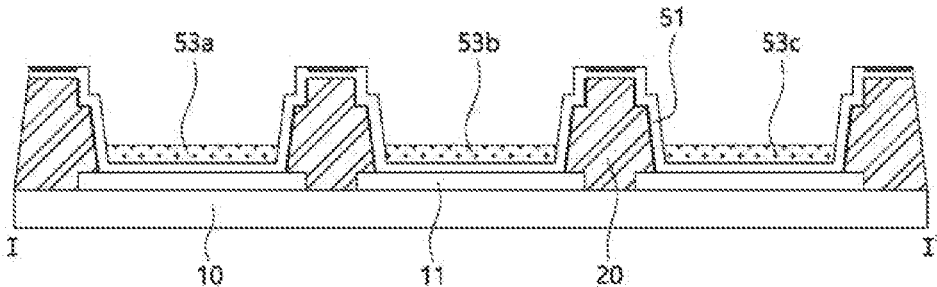
Figure 4G:
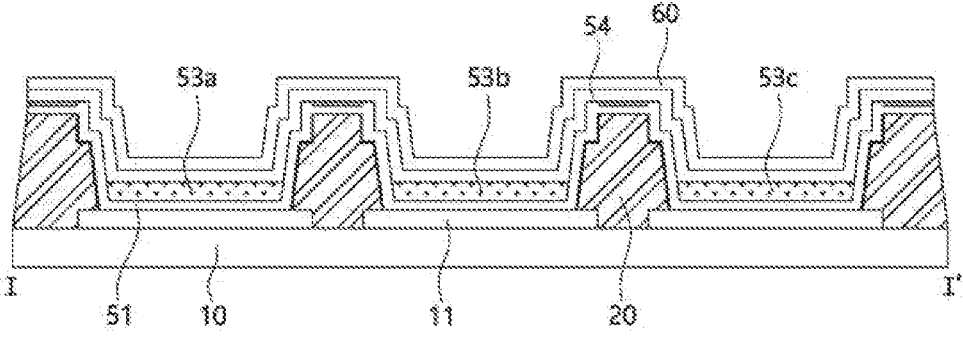
Figure 5A:
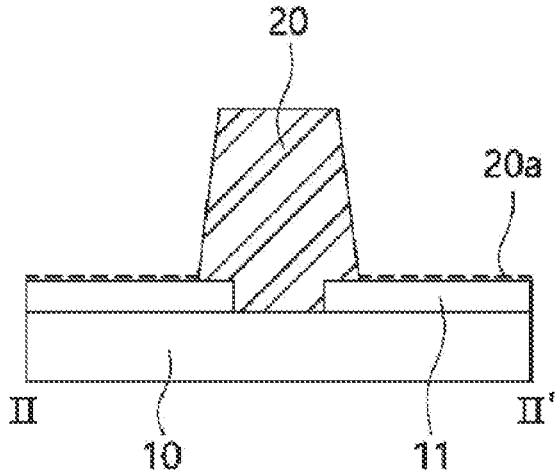
FIGS. 5A and 5B are process cross-sectional views of an organic light emitting display panel taken along line II-II' of FIG. 2 according to the first embodiment of the present disclosure.
Figure 5B:
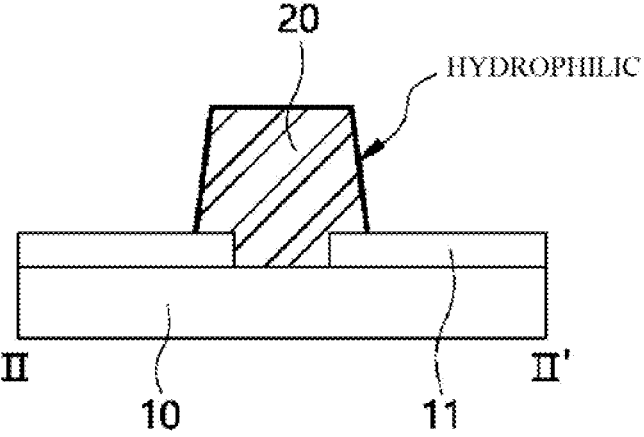

FIGS. 4A to 4G are process cross-sectional views of an organic light emitting display panel taken along line I-I' of FIG. 1 according to the first embodiment of the present disclosure, and FIGS. 5A and 5B are process cross-sectional views of an organic light emitting display panel taken along line II-II' of FIG. 1 according to the first embodiment of the present disclosure.

In FIGS. 4A to 4G and FIGS. 5A and 5B, a process of forming a TFT 70 is not described and only a process of forming a light emitting device is illustrated. Therefore, a substrate 10 illustrated in FIGS. 4A to 4G and FIGS. 5A and 5B can include all of the substrate 80, the TFT 70, and the planarization layer 85 illustrated in FIG. 3. Meanwhile, additional layers or structures can be optionally included in the substrate 10.

As illustrated in FIGS. 4A and 5A, a plurality of first electrodes 11 of an OLED can be respectively formed in a plurality of subpixel areas P in a substrate 10 including the plurality of subpixel areas P.

A hydrophobic organic insulating material can be coated on the substrate 10 with the first electrodes 11 formed thereon. By selectively removing the hydrophobic organic insulating material, a bank layer 20 having a lattice form can be formed at a boundary portion between adjacent subpixel areas to overlap an edge of the first electrode 11.

When the hydrophobic organic insulating material is selectively removed for forming the bank layer 20, an organic residual layer 20a can be on a surface of the first electrode 11.

As illustrated in FIGS. 4B and 5B, by performing a plasma printing process on an upper edge and a lateral surface of the bank layer 20 in a vertical direction, a portion of each of the upper edge and the lateral surface of the bank layer 20 in a horizontal direction, and a surface of the first electrode 11, an organic residual layer 20a remaining in the surface of the first electrode 11 can be removed, and simultaneously, a portion of a top surface of the bank layer 20 and an edge and a lateral surface of the top surface can be, or become, hydrophilic.

This will be described in more detail.

The plasma printing process can use an $O_2/N_2/Ar$ gas, and the plasma printing process can be selectively performed by using a scan type. For example, in FIG. 1, a plasma printing direction is referred to by reference numeral "30".

The plasma printing process can be performed based on the scan type along vertical-direction subpixels to overlap edges of upper surfaces of two adjacent bank layers 20 in a vertical direction among a plurality of bank layers 20 having a lattice form.

Therefore, a step can be formed by removing, by a certain depth, edges of upper surfaces of two adjacent bank layers 20 in the vertical direction, and as illustrated in FIG. 5B, an upper surface of a bank layer 20 adjacent to a subpixel area in a horizontal direction among the plurality of bank layers 20 having a lattice form. Further, a portion, where a step is formed in the vertical direction, of the bank layer 20, a lateral surface of the bank layer 20 in the vertical layer, and an upper surface and a lateral surface of the bank layer 20 in the horizontal direction can be, or become, hydrophilic.

As illustrated in FIG. 4C, a first organic material layer 51 can be formed on a whole surface of the substrate 10 including the first electrode 11 and the bank layer 20 by using a deposition process.

The first organic material layer 51 can include the hole injection layer (HIL) and the hole transport layer (HTL). However, the hole injection layer need not be formed.

Therefore, in FIG. 4C, the first organic material layer 51 is illustrated as a single layer, but is not limited thereto, and can be formed of a multilayer including the hole injection layer (HIL) and the hole transport layer (HTL), as well as other layers depending on use.

As illustrated in FIG. 4D, $CF_4$ or $SF_6$ gas plasma treatment can be performed on a surface of the first organic material layer 51 on the bank layer 20, and thus, a surface of the first organic material layer 51 on the bank layer 20 can be, or become, hydrophobic.

This will be described in more detail.

Figure 6:
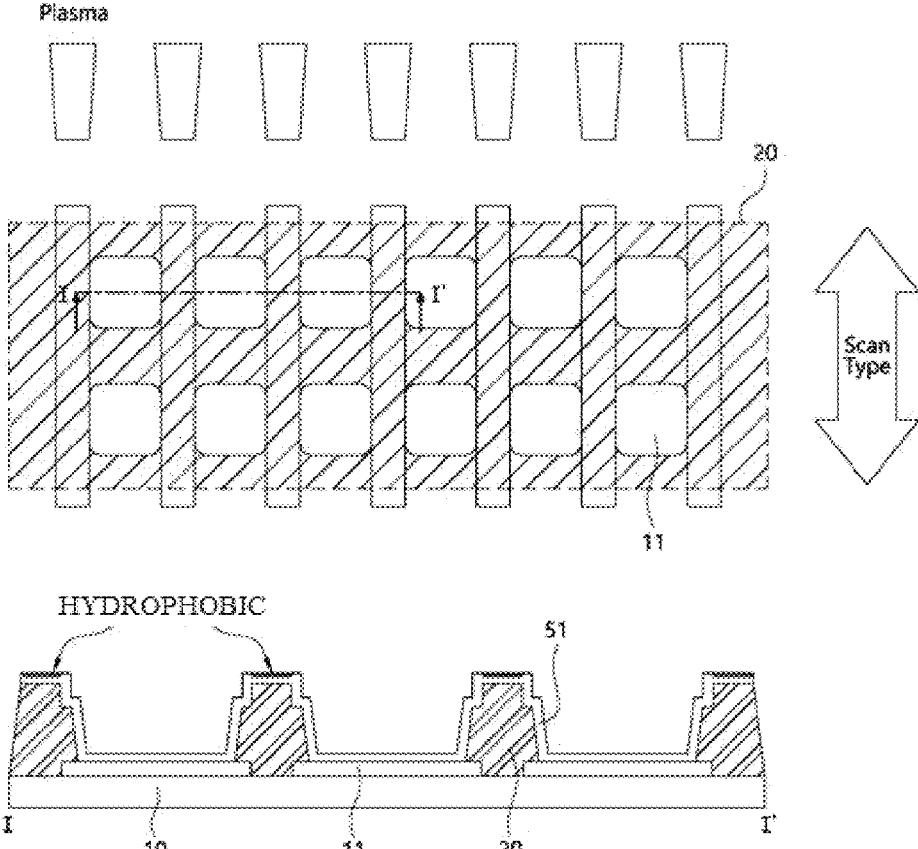
FIG. 6 is a plan view and a cross-sectional view for describing hydrophobic plasma treatment method performed on an upper side of a bank layer according to an embodiment of the present disclosure.
Figure 7:
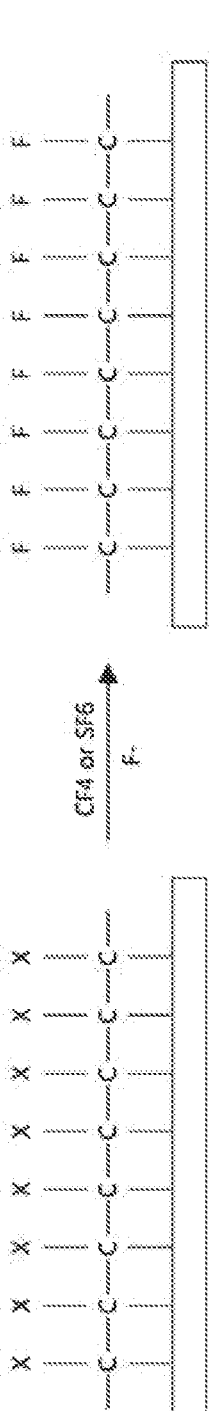
FIG. 7 is a schematic diagram describing a chemical structure of a surface of an organic material layer in performing hydrophobic plasma treatment according to an embodiment of the present disclosure.

FIG. 6 is a plan view and a cross-sectional view for describing hydrophobic plasma treatment method performed on an upper side of a bank layer according to an embodiment of the present disclosure, and FIG. 7 is a schematic diagram describing a chemical structure of a surface of an organic material layer in performing hydrophobic plasma treatment according to an embodiment of the present disclosure.

As illustrated in FIG. 6, $CF_4$ or $SF_6$ gas plasma treatment can be performed on only the first organic material layer 51 on the bank layer 20 in a vertical direction (a first direction) among a plurality of bank layers 20 having a lattice form by using a scan type.

As illustrated in FIG. 7, before the $CF_4$ or $SF_6$ gas plasma treatment, a surface of the first organic material layer 51 can have a chemical structure where an end group X thereof is bonded to carbon (C).

As illustrated in FIG. 6, $CF_4$ or $SF_6$ gas plasma treatment can be performed on only the first organic material layer 51 on the bank layer 20 by using a scan type, and thus, a surface of the first organic material layer 51 on which the $CF_4$ or $SF_6$ gas plasma treatment has been performed can have a chemical structure where an end group X thereof is substituted into fluorine and is bonded to carbon (C).

Therefore, $CF_4$ or $SF_6$ gas plasma treatment can be selectively performed on only the first organic material layer 51 on the bank layer 20, and thus, a surface of the first organic material layer 51 on the bank layer 20 can be hydrophobic.

As illustrated in FIG. 4E, the first organic material layer 51 on the bank layer 20 can be hydrophobic, and then, the second organic material solutions 52a to 52c can be dropped on the first organic material layer 51 of each subpixel area P.

In this case, the spreadability of the second organic material solutions 52a to 52c can be determined based on a surface tension of the second organic material solutions 52a to 52c, surface energy of the first electrode 11 disposed in each subpixel area P contacting the second organic material solutions 52a to 52c, and surface energy of the bank layer 20 disposed at a boundary portion of each subpixel area P.

For example, as a surface tension of the second organic material solutions 52a to 52c is progressively reduced, the spreadability of the second organic material solutions 52a to 52c can be improved, and as surface energy of a surface contacting the dropped second organic material solutions 52a to 52c increases progressively, spreadability can be improved.

Furthermore, second organic material solutions 52a to 52c having a low surface tension can be non-uniformly dried in a dry process, the thickness uniformity of each layer configuring the second organic material solutions 52a to 52c can be reduced. Accordingly, second organic material solutions 52a to 52c having a relatively high surface tension can be used.

Moreover, the dropped second organic material solutions 52a to 52c can be on a top surface of the bank layer 20 as well as a top surface of the first electrode 11.

In the organic light emitting display panel according to the first embodiment of the present disclosure, a top surface of the first organic material layer 51 on the bank layer 20 in a vertical direction can have a hydrophobic characteristic, and thus, surface energy of the first organic material layer 51 on the bank layer 20 in the vertical direction can decrease.

Therefore, second organic material solutions 52a to 52c dropped in each subpixel area P can be prevented from being mixed with second organic material solutions 52a to 52c dropped in each subpixel area P adjacent thereto in a horizontal direction.

At this time, because the first organic material layer 51 on other portions of the bank layer 20 is not hydrophobic, the same second organic material solutions 52a to 52c can be dropped in each subpixel area P adjacent thereto in the vertical direction.

As illustrated in FIG. 4F, by performing a process of drying the dropped second organic material solutions 52a to 52c, a solvent of the second organic material solutions 52a to 52c can be vaporized and only a solute of the second organic material solutions 52a to 52c can remain on the first organic material layer 51, and thus, the second organic material solutions 52a to 52c can be formed on the first organic material layer 51.

The second organic material solutions 52a to 52c can include the emission layer EML illustrated in FIG. 2.

For example, the second organic material solutions 52a to 52c (for example, a red emission material solution 52a, a green emission material solution 52b, and a blue emission material solution 52c) can be dropped and dried on the first organic material layer 51 of each subpixel area P, and thus, a red emission layer 53a, a green emission layer 53b, and a blue emission layer 53c can be formed.

As illustrated in FIG. 4G, a third organic material layer 54 can be formed on the substrate 10 with second organic material layers 53a to 53c formed thereon by using a deposition process.

The third organic material layer 54 can include the electron transport layer (ETL) and the electron injection layer (EIL) illustrated in FIG. 2. Therefore, in FIG. 4G, the third organic material layer 54 is illustrated as a single layer, but is not limited thereto and can be formed of a multilayer.

Moreover, a second electrode 60 can be formed on the substrate 10 with the third organic material layer 54 formed thereon by using a deposition process.

Furthermore, in a light emitting device having a single stack structure described above with reference to FIG. 2, there can be a thickness difference between a hole injection layer and a hole transport layer in each subpixel due to a cavity difference between red, green, and blue subpixels.

Moreover, in a soluble solution process such as an inkjet printing process, there can be a possibility that a pile-up region extends when a thickness increases, and particularly, a red subpixel having a relatively high thickness can be affected by a pile-up risk.

Therefore, a pile-up effect can be removed or avoided by performing an inkjet printing process and a deposition process in combination. Meanwhile, a treatment to generate hydrophobicity need not be limited to a plasma treatment, but can include any treatment on a surface of a layer that can generate or change a characteristic of the surface with respect to hydrophobicity or hydrophilicity. Such a treatment can include any treatment, such as a plasma treatment, that can generate or change hydrophobicity, change hydrophilicity to hydrophobicity, reduce hydrophilicity at the surface from a previously higher amount to a lower amount, or increase hydrophobicity from a previously lower level to a higher level.

An organic light emitting display panel and a method of manufacturing the same according to a second embodiment of the present disclosure for removing the pile-up effect will be described below.

FIG. 8 is a structure diagram illustrating a process performed on each layer for removing a pile-up effect in a light emitting device having a single stack structure according to a second embodiment of the present disclosure.

The light emitting device according to the second embodiment of the present disclosure, as illustrated in FIG. 8, can have a single stack structure where a hole injection layer (HIL), a first hole transport layer (HTL1), a second hole transport layer (HTL2), an emission layer (EML), an electron transport layer (ETL), and an electron injection layer (EIL) are sequentially stacked between a first electrode (Anode; ITO) and a second electrode (Cathode; Metal). Here, the hole injection layer (HIL) need not be provided.

Here, the hole injection layer (HIL) and the first hole transport layer (HTL1) can be formed by a deposition process, the second hole transport layer (HTL2) and the emission layer (EML) can be formed by an inkjet printing process (a soluble process), and the electron transport layer (ETL), the electron injection layer (EIL), and the second electrode can be formed by a deposition process.

A structure of the organic light emitting display panel according to the second embodiment of the present disclosure for removing a pile-up effect in the light emitting device having the single stack structure will be described below.

Figure 9:
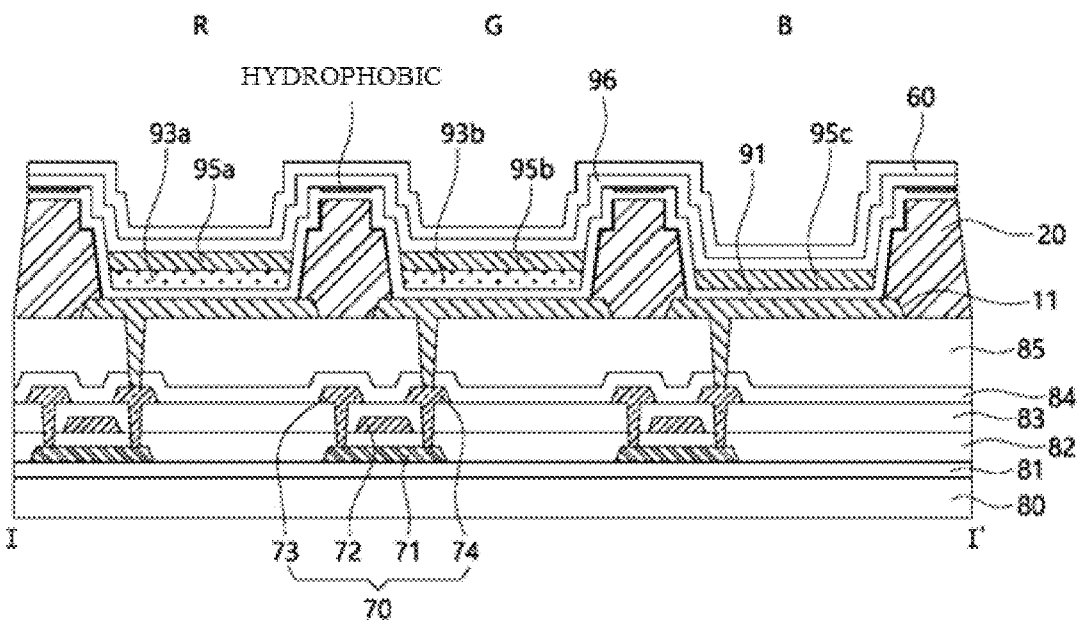
FIG. 9 is a structure cross-sectional view of an organic light emitting device according to the second embodiment of the present disclosure.

FIG. 9 is a structure cross-sectional view of an organic light emitting device according to the second embodiment of the present disclosure.

The organic light emitting device according to the second embodiment of the present disclosure, as illustrated in FIG. 9, can include a TFT 70 and an organic light emitting device, which are provided in each of red, green, and blue subpixel areas R, G, and B on a substrate 80.

The substrate 80 can include an insulating material, and for example, the substrate 80 can include glass or a plastic material such as polyimide (PI).

A buffer layer 81 can be disposed on the substrate 80. The buffer layer 81 can include a single layer, including SiNx or SiOx which is an inorganic material, or a multilayer including SiNx and SiOx. However, the buffer layer 81 need not be an essential element and can be omitted based on the kind and material of the substrate 80 and a structure and a type of the TFT 70.

The TFT 70 can be disposed on the buffer layer 81. The TFT 70 can include an active layer 71, a gate electrode 72, a source electrode 73, and a drain electrode 74.

The active layer 71 of the TFT 70 can be disposed on the buffer layer 81, and a gate insulation layer 82 can be disposed on the active layer 71 and the buffer layer 81.

The active layer 71 can include a-Si, poly-Si, an oxide semiconductor, or an organic semiconductor.

The gate insulation layer 82 can include a single layer, including SiNx or SiOx which is an inorganic material, or a multilayer including SiNx and SiOx, but is not limited thereto.

A first contact hole, through which each of the source electrode 73 and the drain electrode 74 contacts the active layer 71, can be formed in the gate insulation layer 82.

The gate electrode 72 can be disposed on the gate insulation layer 82 to overlap the active layer 71. The gate electrode 72 can include a conductive metal (for example, Cu, Al, Mo, or an alloy thereof), but is not limited thereto.

An interlayer insulation layer 83 can be disposed on the gate electrode 72 and the gate insulation layer 82. The interlayer insulation layer 83 can include a single layer, including SiNx or SiOx which is an inorganic material, or a multilayer including SiNx and SiOx, but is not limited thereto. A second contact hole, through which each of the source electrode 73 and the drain electrode 74 contacts the active layer 71, can be formed in the interlayer insulation layer 83.

The source electrode 73 and the drain electrode 74 can be disposed on the interlayer insulation layer 83. The source electrode 73 and the drain electrode 74 can include a conductive metal (for example, Cu, Al, Mo, or an alloy thereof), but are not limited thereto. Each of the source electrode 73 and the drain electrode 74 can be electrically connected to the active layer 71 through the first contact hole and the second contact hole.

A passivation layer 84 can be disposed on the TFT 70 and the interlayer insulation layer 83. The passivation layer 84 can include a single layer, including SiNx or SiOx which is an inorganic material, or a multilayer including SiNx and SiOx, but is not limited thereto.

A third contact hole for enabling a first electrode 11 of an OLED to be connected to the drain electrode 74 of the TFT 70 can be formed in the passivation layer 84. The passivation layer 84 need not be an essential element and can be omitted based on a design of the organic light emitting display panel.

A planarization layer 85 can be disposed on the passivation layer 84. The planarization layer 85 can include an organic material, and a fourth contact hole for exposing the drain electrode 74 of the TFT 70 can be formed in the planarization layer 85.

The first electrode 11 can be disposed in each subpixel area on the planarization layer 85 where a plurality of subpixel areas P including the red, green, and blue subpixels R, G, and B are defined, and the bank layer 20 can be disposed on the planarization layer 85 at a boundary portion between the subpixel areas P to overlap an edge of the first electrode 11.

An edge and a lateral surface of a top surface of the bank layer 20 in a vertical direction (a first direction) can be hydrophilic, and the top surface and the lateral surface of the bank layer 20 adjacent to each subpixel area in a horizontal direction (a second direction) can be hydrophilic.

A first organic material layer 91 can be formed on the top surface and the lateral surface of the bank layer 20 and an upper side of the first electrode 11, and the first organic material layer 91 on the bank layer 20 can be, or become, hydrophobic optionally.

A plurality of second hole transport layers 93a and 93b and emission layers 95a and 95b can be disposed on the first organic material layer 91 of each of the red subpixel area R and the green subpixel area G except the bank layer 20, and only an emission layer 95c can be disposed on a first organic material layer 91 of a blue subpixel area B.

A third organic material layer 96 can be disposed on the emission layers 95a to 95c and the first organic material layer 91 over the bank layer 20, and a second electrode 60 can be disposed on the third organic material layer 96.

Here, the first organic material layer can include a hole injection layer (HIL) and a first hole transport layer (HTL1), and the third organic material layer can include an electron transport layer (ETL) and an electron injection layer (EIL).

A method of manufacturing an organic light emitting display panel according to the second embodiment of the present disclosure having a structure illustrated in FIG. 9 will be described below.

FIGS. 10A to 10I are process cross-sectional views of an organic light emitting display panel taken along line I-I' of FIG. 1 according to the second embodiment of the present disclosure.

In FIGS. 10A to 10I, a process of forming a TFT 70 is not described and only a process of forming a light emitting device is illustrated. Therefore, a substrate 10 illustrated in FIGS. 10A to 10I can include all of the substrate 80, the TFT 70, and the planarization layer 85 illustrated in FIG. 9. Meanwhile, additional layers or structures can be optionally included in the substrate 10.

Figure 10A:
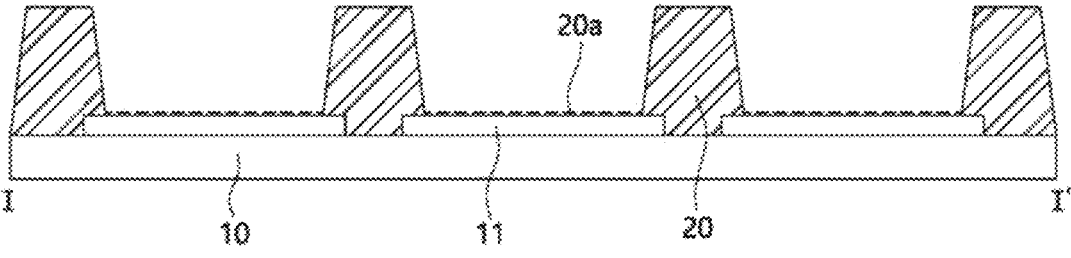
FIGS. 10A to 10I are process cross-sectional views of an organic light emitting display panel taken along line I-I' of FIG. 1 according to the second embodiment of the present disclosure.

As illustrated in FIG. 10A, a plurality of first electrodes 11 can be respectively formed in a plurality of subpixel areas P on a substrate 10 including the plurality of subpixel areas P.

Moreover, an insulating material can be deposited on the substrate 10 with the first electrodes 11 formed thereon and can be selectively removed, and thus, a bank layer 20 having a lattice form can be formed at a boundary portion between adjacent subpixel areas.

The bank layer 20 can include an organic material or an inorganic material.

Here, when a hydrophobic organic insulating material is selectively removed for forming the bank layer 20, an organic residual layer 20a can be on a surface of the first electrode 11.

Figure 10B:
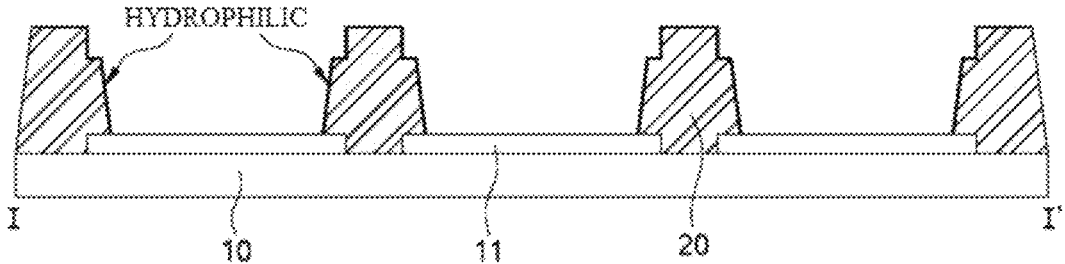

As illustrated in FIGS. 10B and 5B, by performing a plasma printing process on an upper edge and a lateral surface of the bank layer 20 in a vertical direction, a portion of each of the upper edge and the lateral surface of the bank layer 20 in a horizontal direction, and a surface of the first electrode 11, the organic residual layer 20a remaining in the surface of the first electrode 11 can be removed, and simultaneously, a portion of a top surface of the bank layer 20 and an edge and a lateral surface of the top surface can be hydrophilic.

This will be described in more detail.

The plasma printing process can use an $O_2/N_2/Ar$ gas, and the plasma printing process can be selectively performed by using a scan type. For example, in FIG. 1, a plasma printing direction is referred to by reference numeral "30".

The plasma printing process can be performed based on the scan type along vertical-direction subpixels to overlap edges of upper surfaces of two adjacent bank layers 20 in a vertical direction among a plurality of bank layers 20 having a lattice form.

Therefore, a step can be formed by removing, by a certain depth, edges of upper surfaces of two adjacent bank layers 20 in the vertical direction, and as illustrated in FIG. 5B, an upper surface of a bank layer 20 adjacent to a subpixel area in a horizontal direction among the plurality of bank layers 20 having a lattice form. Further, a portion, where a step is formed in the vertical direction, of the bank layer 20, a lateral surface of the bank layer 20 in the vertical layer, and an upper surface and a lateral surface of the bank layer 20 in the horizontal direction can be hydrophilic.

Figure 10C:
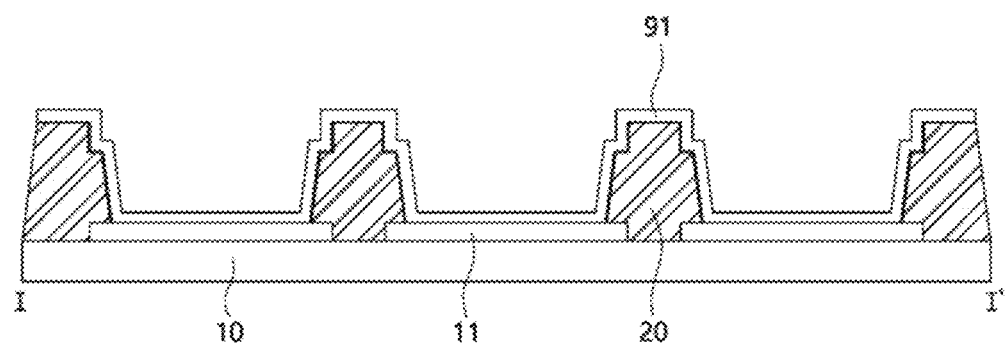

As illustrated in FIG. 10C, a first organic material layer 91 can be formed on a whole surface of the substrate 10 including the first electrode 11 and the bank layer 20 by using a deposition process.

The first organic material layer 91 can include the hole injection layer (HIL) and the hole transport layer (HTL) illustrated in FIG. 8. However, the hole injection layer need not be formed.

Therefore, in FIG. 10C, the first organic material layer 91 is illustrated as a single layer, but is not limited thereto and can be formed of a multilayer including the hole injection layer (HIL) and the first hole transport layer (HTL1).

Figure 10D:
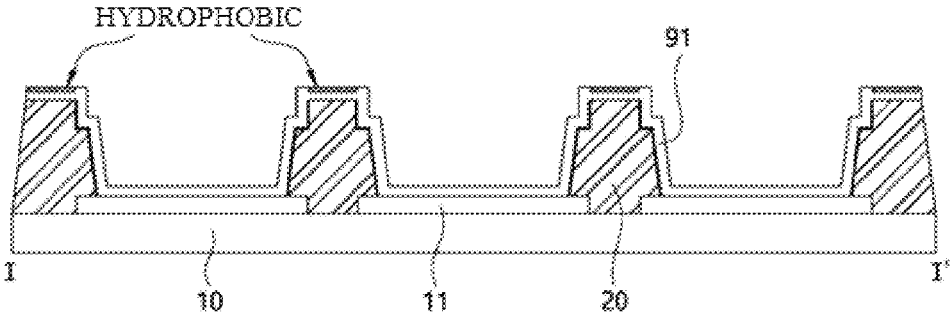

As illustrated in FIG. 10D, $CF_4$ or $SF_6$ gas plasma treatment can be performed on a surface of the first organic material layer 91 on the bank layer 20, and thus, a surface of the first organic material layer 91 on the bank layer 20 can be hydrophobic.

Here, when the first organic material layer 91 includes the hole injection layer (HIL) and the first hole transport layer (HTL1), $CF_4$ or $SF_6$ gas plasma treatment can be performed on a surface of the first hole transport layer (HTL1) on the bank layer 20, and thus, the surface of the first hole transport layer (HTL1) can be hydrophobic.

A detailed description has been given with reference to FIGS. 6 and 7, and thus, any overlapping description is omitted.

Figure 10E:
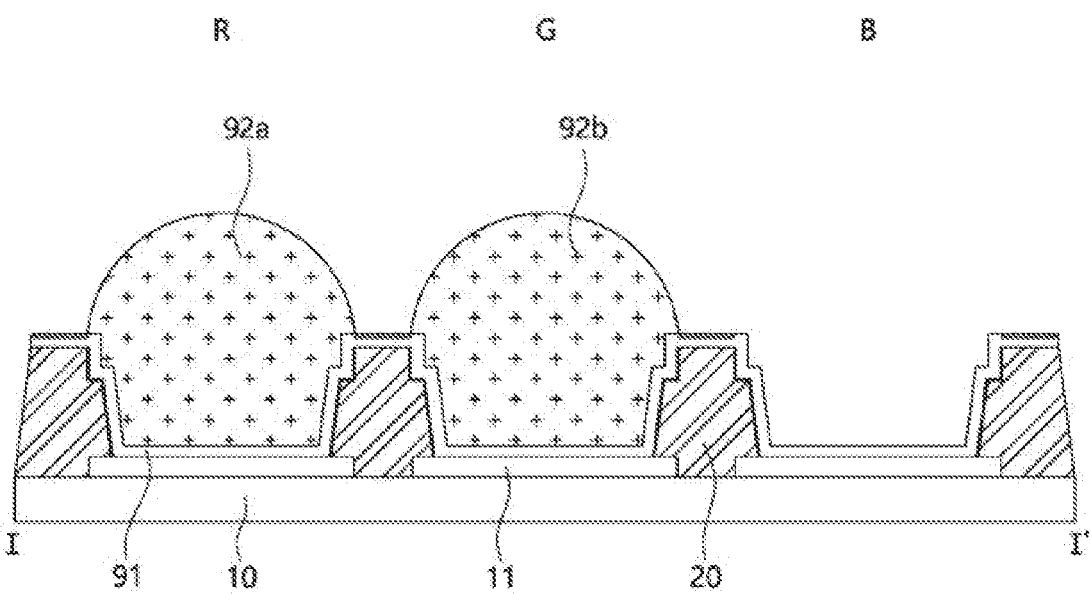

As illustrated in FIG. 10E, when it is assumed that each subpixel area P includes a red subpixel area R, a green subpixel area G, and a blue subpixel area B, second hole transport material solutions 92a and 92b can be dropped on a first organic material layer 91 of each of the red subpixel area R and the green subpixel area G, and a second hole transport material solution need not be dropped in the blue subpixel area B.

Figure 10F:
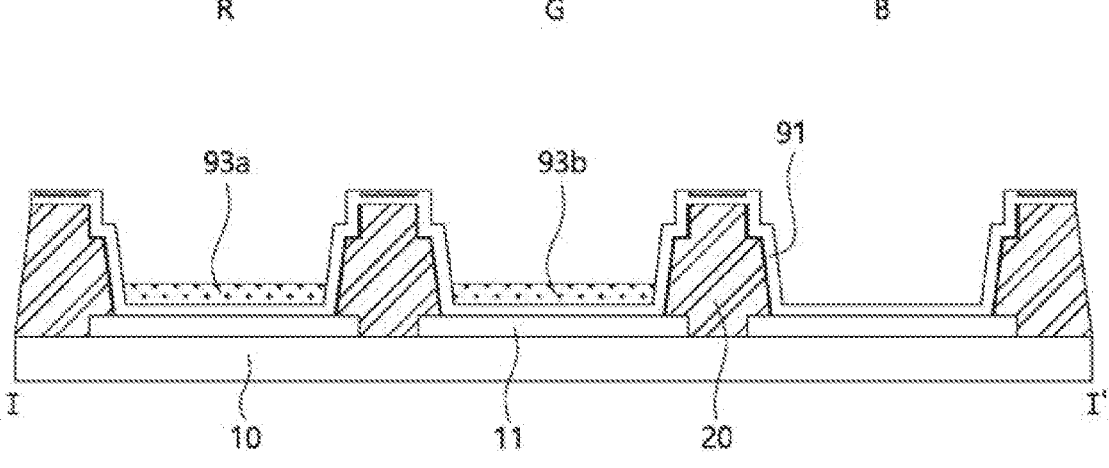

As illustrated in FIG. 10F, a process of drying the dropped second hole transport material solutions 92a and 92b can be performed.

For example, a solvent of each of the second hole transport material solutions 92a and 92b can be vaporized, and only a solute of each of the second hole transport material solutions 92a and 92b can remain on the first organic material layer 91.

Therefore, second hole transport layers 93a to 93b can be formed on the first organic material layer 91 of each of the red subpixel area R and the green subpixel area G. A second hole transport layer need not be formed in the blue subpixel area B.

Figure 10G:
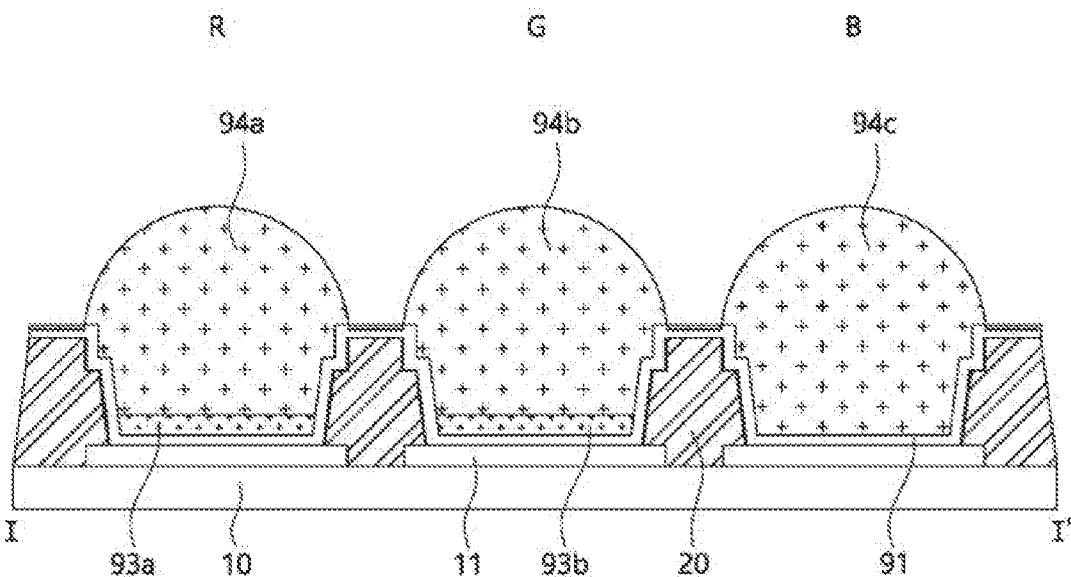

As illustrated in FIG. 10G, a red emission material solution 94a, a green emission material solution 94b, and a blue emission material solution 94c can be respectively dropped in the red subpixel area R, the green subpixel area G, and the blue subpixel area B.

Figure 10H:
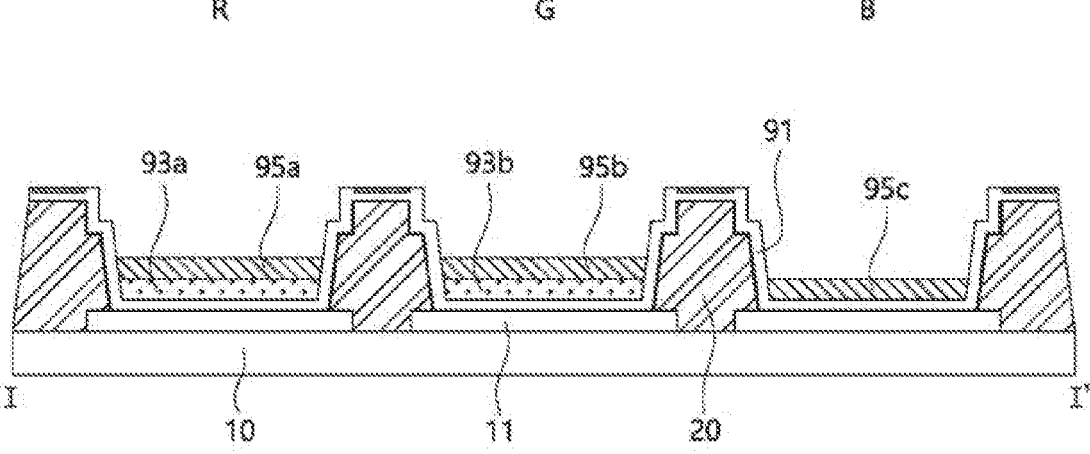

As illustrated in FIG. 10H, a process of drying the dropped red emission material solution 94a, green emission material solution 94b, and blue emission material solution 94c from FIG. 10G can be performed.

For example, a solvent of the red emission material solution 94a, the green emission material solution 94b, and the blue emission material solution 94c can be vaporized, and only a solute of the red emission material solution 94a, the green emission material solution 94b, and the blue emission material solution 94c can remain in each subpixel area.

Therefore, a red emission layer 95a, a green emission layer 95b, and a blue emission layer 95c can be respectively formed in the red subpixel area R, the green subpixel area G, and the blue subpixel area B.

As described above with reference to FIGS. 10E to 10H, the first and second hole transport layers (HTL1 and HTL2) can be formed in the red subpixel area R and the green subpixel area G, but only the first hole transport layer (HTL1) can be formed in the blue subpixel area B, whereby a pile-up effect can be removed.

Figures 10I, 11:
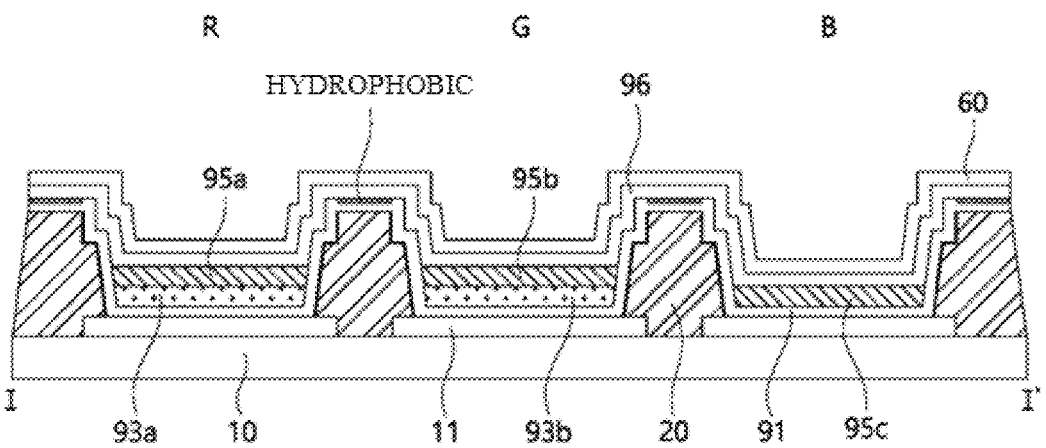
FIG. 11 is a structure diagram illustrating a process performed on each layer and a light emitting device having a multi-stack structure according to a third embodiment of the present disclosure.

As illustrated in FIG. 10I, a third organic material layer 96 can be formed on the substrate 10 with the emission layers 95a to 95c formed thereon by using a deposition process.

The third organic material layer 96 can include the electron transport layer (ETL) and the electron injection layer (EIL) illustrated in FIG. 8. Therefore, in FIG. 10I, the third organic material layer 96 is illustrated as a single layer, but is not limited thereto and can be formed of a multilayer.

Moreover, a second electrode 60 can be formed on the substrate 10 with the third organic material layer 96 formed thereon by using a deposition process.

Furthermore, a light emitting device having a multi-stack structure can be manufactured by performing an inkjet printing process and a deposition process.

FIG. 11 is a structure diagram illustrating a process performed on each layer and a light emitting device having a multi-stack structure according to a third embodiment of the present disclosure.

The light emitting device according to the third embodiment of the present disclosure, as illustrated in FIG. 11, can have a multi-stack structure where a first hole transport layer (HTL1), a first emission layer (EML1), a first electron transport layer (ETL1), an n-type charge generating layer (n-CGL), a p-type charge generating layer (p-CGL), a hole injection layer (HIL), a second hole transport layer (HTL2), a second emission layer (EML2), a second electron transport layer (ETL2), and an electron injection layer (EIL) are sequentially stacked between a first electrode (Anode; ITO) and a second electrode (Cathode; Metal).

Here, a first stack (Stack1) can include the first hole transport layer (HTL1), the first emission layer (EML1), and the first electron transport layer (ETL1), and a second stack (Stack2) can include the hole injection layer (HIL), the second hole transport layer (HTL2), the second emission layer (EML2), the second electron transport layer (ETL2), and the electron injection layer (EIL). Therefore, a charge generating layer can be disposed between the first and second stacks.

The first hole transport layer (HTL1) and the first emission layer (EML1) can be formed by an inkjet printing process (a soluble process).

The first electron transport layer (ETL1), the n-type charge generating layer (n-CGL), and the p-type charge generating layer (p-CGL) can be formed by a deposition process.

The second hole transport layer (HTL2) and the second emission layer (EML2) can be formed by an inkjet printing process (a soluble process).

The second electron transport layer (ETL2), the electron injection layer (EIL), and the second electrode can be formed by a deposition process.

A structure of the organic light emitting display panel having the multi-stack structure according to the third embodiment of the present disclosure will be described below.

Figure 12:
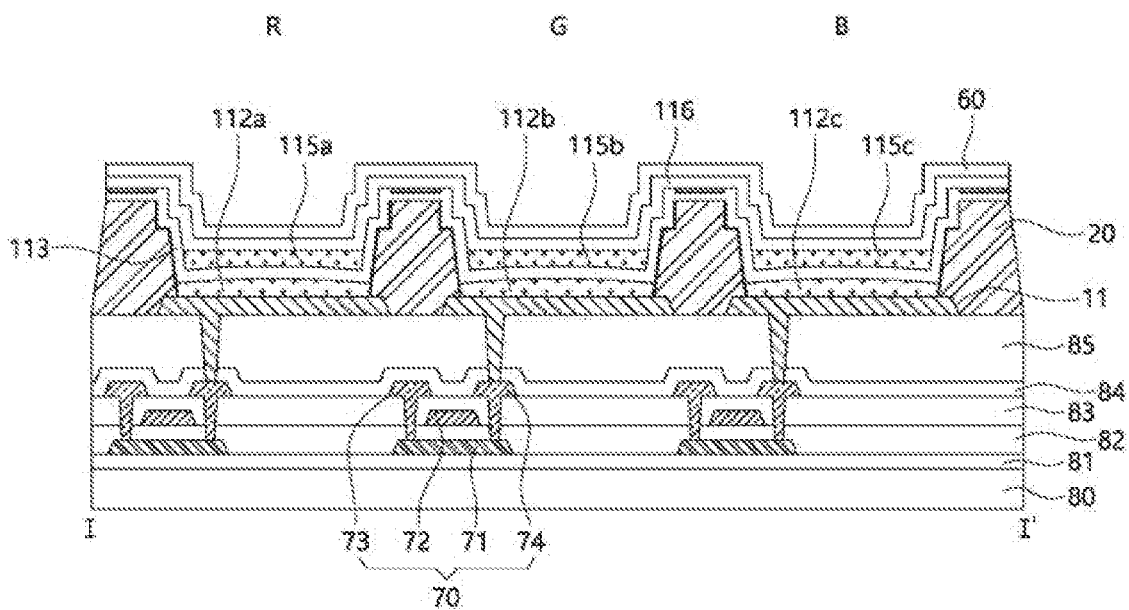
FIG. 12 is a structure cross-sectional view of an organic light emitting device according to the third embodiment of the present disclosure.

FIG. 12 is a structure cross-sectional view of an organic light emitting device according to the third embodiment of the present disclosure.

The organic light emitting device according to the third embodiment of the present disclosure, as illustrated in FIG. 12, can include a TFT 70 and an organic light emitting device, which are provided in each of a plurality of subpixel areas P on a substrate 80.

The substrate 80 can include an insulating material, and for example, the substrate 80 can include glass or a plastic material such as polyimide (PI).

A buffer layer 81 can be disposed on the substrate 80. The buffer layer 81 can include a single layer, including SiNx or SiOx which is an inorganic material, or a multilayer including SiNx and SiOx. However, the buffer layer 81 need not be an essential element and can be omitted based on the kind and material of the substrate 80 and a structure and a type of the TFT 70.

The TFT 70 can be disposed on the buffer layer 81. The TFT 70 can include an active layer 71, a gate electrode 72, a source electrode 73, and a drain electrode 74.

The active layer 71 of the TFT 70 can be disposed on the buffer layer 81, and a gate insulation layer 82 can be disposed on the active layer 71 and the buffer layer 81.

The active layer 71 can include a-Si, poly-Si, an oxide semiconductor, or an organic semiconductor.

The gate insulation layer 82 can include a single layer, including SiNx or SiOx which is an inorganic material, or a multilayer including SiNx and SiOx, but is not limited thereto.

A first contact hole, through which each of the source electrode 73 and the drain electrode 74 contacts the active layer 71, can be formed in the gate insulation layer 82.

The gate electrode 72 can be disposed on the gate insulation layer 82 to overlap the active layer 71. The gate electrode 72 can include conductive metal (for example, Cu, Al, Mo, or an alloy thereof), but is not limited thereto.

An interlayer insulation layer 83 can be disposed on the gate electrode 72 and the gate insulation layer 82. The interlayer insulation layer 83 can include a single layer, including SiNx or SiOx which is an inorganic material, or a multilayer including SiNx and SiOx, but is not limited thereto. A second contact hole, through which each of the source electrode 73 and the drain electrode 74 contacts the active layer 71, can be formed in the interlayer insulation layer 83.

The source electrode 73 and the drain electrode 74 can be disposed on the interlayer insulation layer 83. The source electrode 73 and the drain electrode 74 can include conductive metal (for example, Cu, Al, Mo, or an alloy thereof), but are not limited thereto. Each of the source electrode 73 and the drain electrode 74 can be electrically connected to the active layer 71 through the first contact hole and the second contact hole.

A passivation layer 84 can be disposed on the TFT 70 and the interlayer insulation layer 83. The passivation layer 84 can include a single layer, including SiNx or SiOx which is an inorganic material, or a multilayer including SiNx and SiOx, but is not limited thereto.

A third contact hole for enabling a first electrode 11 of an OLED to be connected to the drain electrode 74 of the TFT 70 can be formed in the passivation layer 84. The passivation layer 84 need not be an essential element and can be omitted based on a design of the organic light emitting display panel.

A planarization layer 85 can be disposed on the passivation layer 84. The planarization layer 85 can include an organic material, and a fourth contact hole for exposing the drain electrode 74 of the TFT 70 can be formed in the planarization layer 85.

The first electrode 11 can be disposed in each subpixel area on the planarization layer 85, and the bank layer 20 can be disposed on the planarization layer 85 at a boundary portion between the subpixel areas P to overlap an edge of the first electrode 11.

An edge and a lateral surface of a top surface of the bank layer 20 in a vertical direction (a first direction) can be hydrophilic, and the top surface and the lateral surface of the bank layer 20 adjacent to each subpixel area in a horizontal direction (a second direction) can be hydrophilic.

A plurality of first organic material layers 112a to 112c can be disposed on the first electrode 11 between adjacent bank layers 20.

A second organic material layer 113 can be disposed on over the first organic material layers 112a to 112c and the bank layer 20, and the second organic material layer 113 on the bank layer 20 can be, or become, hydrophobic optionally.

A plurality of third organic material layers 115a to 115c can be disposed on the second organic material layer 113 between adjacent bank layers 20, and a fourth organic material layer 116 can be disposed on the third organic material layers 115a to 115c and the second organic material layer 113 over the bank layer 20.

Moreover, a second electrode 60 can be disposed on the fourth organic material layer 116.

Here, the first organic material layers 112a to 112c can include a first hole transport layer (HTL1) and a first emission layer (EML1), and the second organic material layer 113 can include a first electron transport layer (ETL1), an n-type charge generating layer (n-CGL), a p-type charge generating layer (p-CGL), and a hole injection layer (HIL).

The third organic material layers 115a to 115c can include a second hole transport layer (HTL2) and a second emission layer (EML2), and the fourth organic material layer 116 can include a second electron transport layer (ETL2) and an electron injection layer (EIL).

A method of manufacturing an organic light emitting display panel according to the third embodiment of the present disclosure having a structure illustrated in FIG. 12 will be described below.

FIGS. 13A to 13I are process cross-sectional views of an organic light emitting display panel taken along line I-I' of FIG. 1 according to the third embodiment of the present disclosure.

In FIGS. 13A to 13I, a process of forming a TFT 70 is not described and only a process of forming a light emitting device is illustrated. Therefore, a substrate 10 illustrated in FIGS. 13A to 13I can include all of the substrate 80, the TFT 70, and the planarization layer 85 illustrated in FIG. 12. Meanwhile, additional layers or structures can be optionally included in the substrate 10.

Figure 13A:
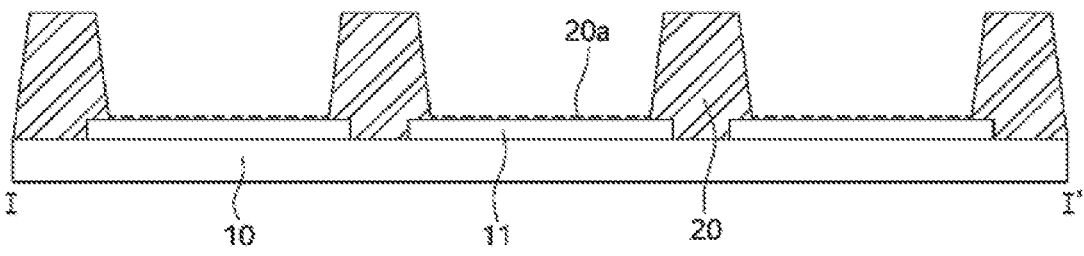
FIGS. 13A to 13I are process cross-sectional views of an organic light emitting display panel taken along line I-I' of FIG. 1 according to the third embodiment of the present disclosure.

As illustrated in FIG. 13A, a plurality of first electrodes 11 can be respectively formed in a plurality of subpixel areas P in a substrate 10 including the plurality of subpixel areas P.

A hydrophobic organic insulating material can be coated on the substrate 10 with the first electrodes 11 formed thereon. By selectively removing the hydrophobic organic insulating material, a bank layer 20 having a lattice form can be formed at a boundary portion between adjacent subpixel areas to overlap an edge of the first electrode 11.

Here, when the hydrophobic organic insulating material is selectively removed for forming the bank layer 20, an organic residual layer 20a can be on a surface of the first electrode 11.

Figure 13B:
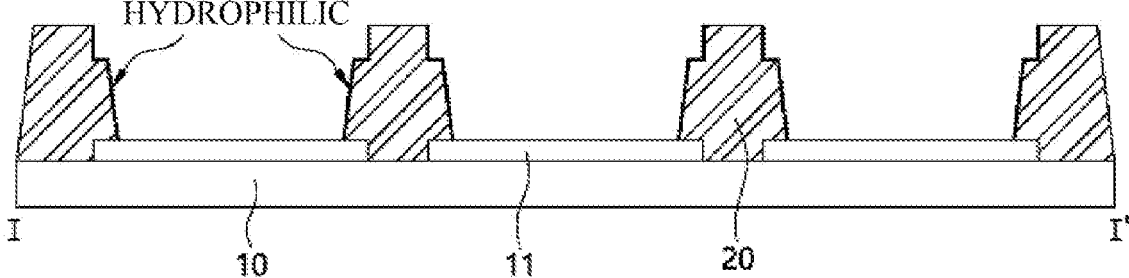

As illustrated in FIGS. 13B and 5B, by performing a plasma printing process on an upper edge and a lateral surface of the bank layer 20 in a vertical direction, a portion of each of the upper edge and the lateral surface of the bank layer 20 in a horizontal direction, and a surface of the first electrode 11, an organic residual layer 20a remaining in the surface of the first electrode 11 can be removed, and simultaneously, a portion of a top surface of the bank layer 20 and an edge and a lateral surface of the top surface can be hydrophilic.

This will be described in more detail.

The plasma printing process can use an $O_2/N_2/Ar$ gas, and the plasma printing process can be selectively performed by using a scan type. For example, in FIG. 1, a plasma printing direction is referred to by reference numeral "30".

The plasma printing process can be performed based on the scan type along vertical-direction subpixels to overlap edges of upper surfaces of two adjacent bank layers 20 in a vertical direction among a plurality of bank layers 20 having a lattice form.

Therefore, a step can be formed by removing, by a certain depth, edges of upper surfaces of two adjacent bank layers 20 in the vertical direction, and as illustrated in FIG. 5B, an upper surface of a bank layer 20 adjacent to a subpixel area in a horizontal direction among the plurality of bank layers 20 having a lattice form. Further, a portion, where a step is formed in the vertical direction, of the bank layer 20, a lateral surface of the bank layer 20 in the vertical layer, and an upper surface and a lateral surface of the bank layer 20 in the horizontal direction can be hydrophilic.

Figure 13C:
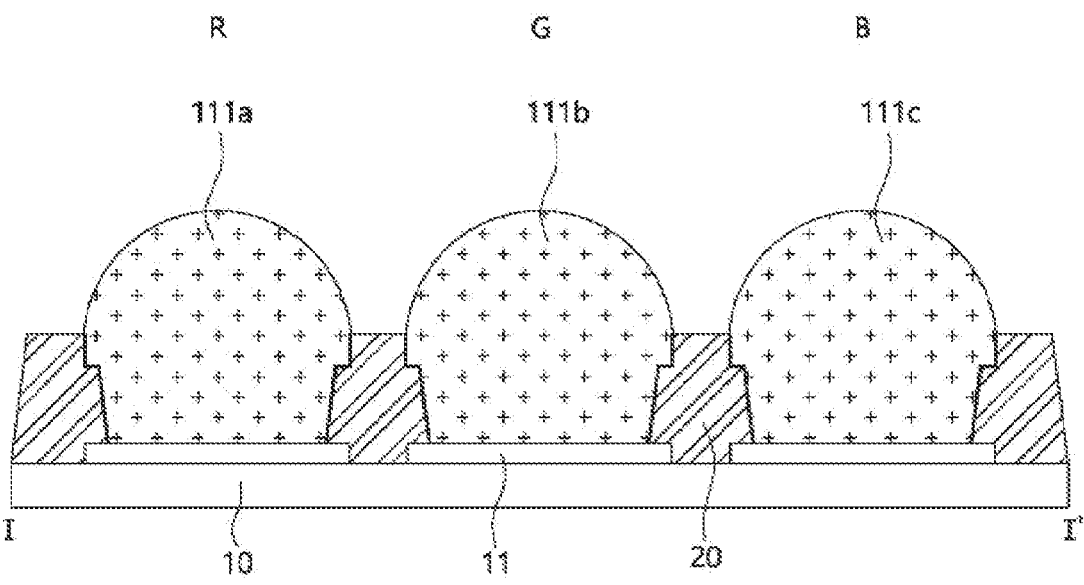

As illustrated in FIG. 13C, first organic material solutions 111a to 111c can be dropped on an upper portion of the first electrode 11 of each subpixel area P through an inkjet printing process (a soluble process).

At this time, because a top surface of the bank layer 20 has a hydrophobic characteristic, surface energy of the top surface of the bank layer 20 can decrease, and thus, first organic material solutions 111a to 111c dropped in each subpixel area P can be prevented from being mixed with first organic material solutions 111a to 111c dropped in each subpixel area P adjacent thereto in a horizontal direction.

Moreover, because an upper portion of the bank layer 20 in the horizontal direction is hydrophilic, the same first organic material solutions 111a to 111c can be dropped in each subpixel area P adjacent thereto in the vertical direction.

Figure 13D:
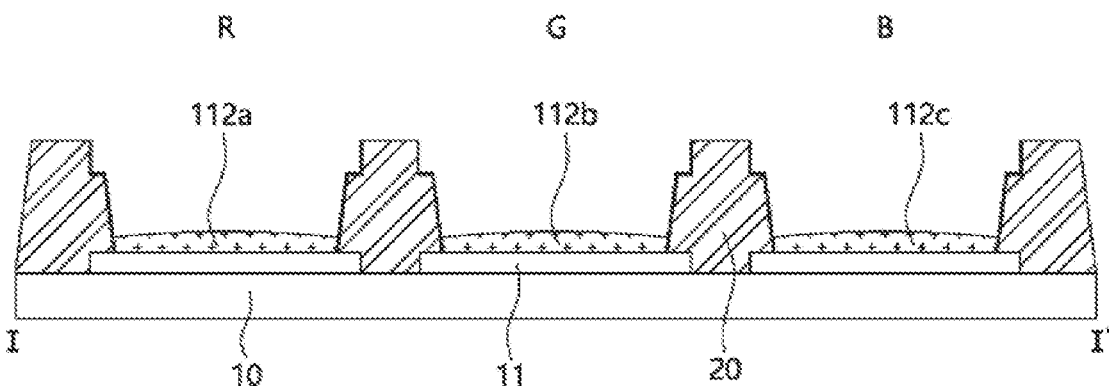

As illustrated in FIG. 13D, by performing a process of drying the dropped first organic material solutions 111a to 111c, a solvent of the first organic material solutions 111a to 111c can be vaporized and only a solute of the first organic material solutions 111a to 111c can remain on the first electrode 11, and thus, first organic material layers 112a to 112c can be formed on the first electrode 11.

Here, the first organic material layers 112a to 112c can include the first hole transport layer (HTL1) and the first emission layer (EML1) illustrated in FIG. 11.

Therefore, in FIG. 13D, each of the first organic material layers 112a to 112c is illustrated as a single layer, but is not limited thereto and can be formed of a multilayer.

For example, when the first organic material layers 112a to 112c include the first hole transport layer (HTL1) and the first emission layer (EML1), the following process can be performed.

As described above with reference to FIGS. 13C and 13D, a hole transport material solution can be dropped on the first electrode 11 of each subpixel area P and can be dried, and thus, the first hole transport layer (HTL1) can be formed on the first electrode 11.

It can be assumed that each subpixel area P includes a red subpixel area R, a green subpixel area G, and a blue subpixel area B.

As in FIG. 13C, a red emission material solution, a green emission material solution, and a blue emission material solution can be dropped on a first hole transport layer of each of the red subpixel area R, the green subpixel area G, and the blue subpixel area B, and as described above with reference to FIG. 13D, a red emission layer, a green emission layer, and a blue emission layer can be formed by drying the dropped red emission material solution, green emission material solution, and blue emission material solution.

Figure 13E:
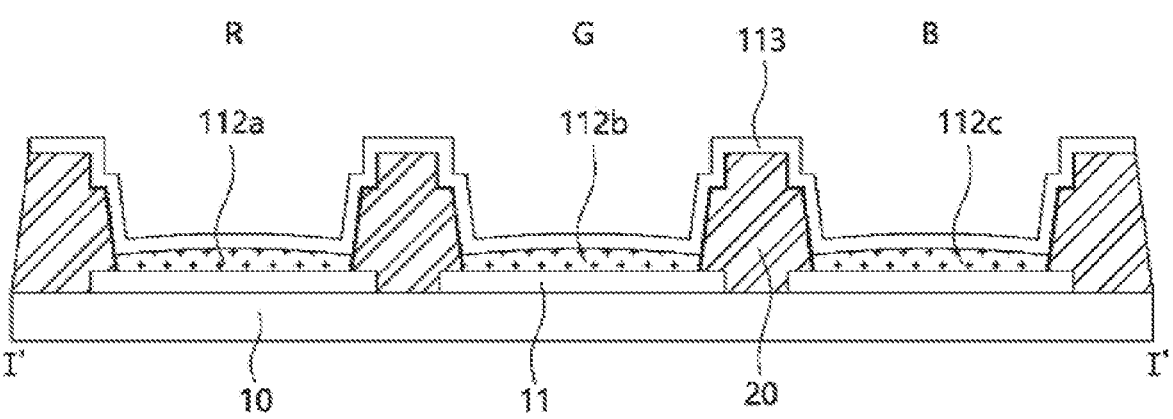

As illustrated in FIG. 13E, a second organic material layer 113 can be formed on a whole surface of the substrate 10 including the first organic material layers 112a to 112c and the bank layer 20 by using a deposition process.

The second organic material layer 113 can include a first electron transport layer (ETL1), an n-type charge generating layer (n-CGL), and a p-type charge generating layer (p-CGL) illustrated in FIG. 11.

For example, the first electron transport layer (ETL1), the n-type charge generating layer (n-CGL), and the p-type charge generating layer (p-CGL) can be sequentially deposited on the whole surface of the substrate 10 including the first organic material layers 112a to 112c and the bank layer 20.

Therefore, in FIG. 13E, the second organic material layer 113 is illustrated as a single layer, but is not limited thereto and can be formed of a multilayer including the first electron transport layer (ETL1), the n-type charge generating layer (n-CGL), the p-type charge generating layer (p-CGL), and the hole injection layer (HIL).

Figure 13F:
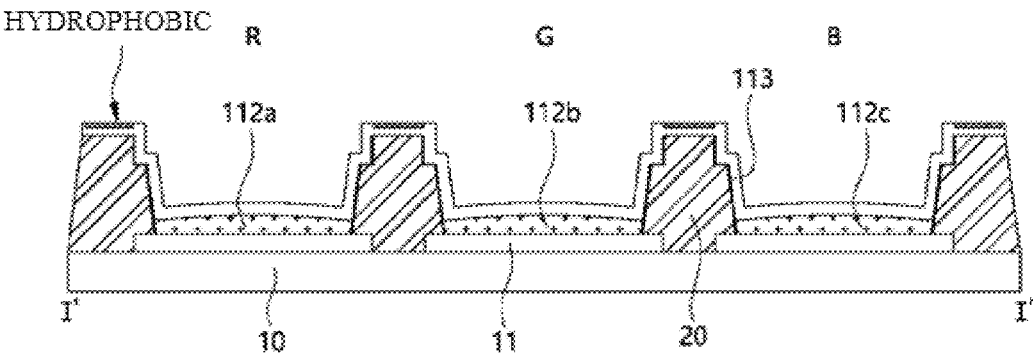

As illustrated in FIG. 13F, $CF_4$ or $SF_6$ gas plasma treatment can be performed on a surface of the second organic material layer 113 on the bank layer 20, and thus, a surface of the second organic material layer 113 on the bank layer 20 can be hydrophobic.

For example, $CF_4$ or $SF_6$ gas plasma treatment can be performed on a surface, disposed on the bank layer 20, of the hole injection layer (HIL) formed at an uppermost portion in the second organic material layer 113, and thus, the surface of the hole injection layer (HIL) on the bank layer 20 can be hydrophobic.

A detailed hydrophobic plasma treatment method has been described above with reference to FIGS. 6 and 7, and thus, any overlapping description is omitted.

Figure 13G:
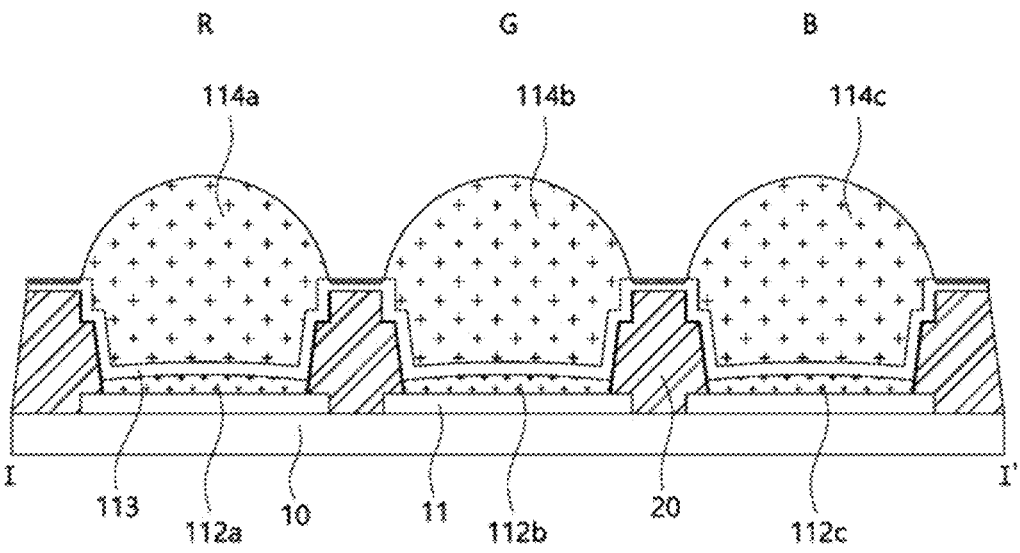

As illustrated in FIG. 13G, third organic material solutions 114*a* to 114*c* can be dropped on the second organic material layer 113 of each subpixel area P.

At this time, because the second organic material layer 113 on the bank layer 20 has a hydrophobic characteristic, surface energy of the second organic material layer 113 on the bank layer 20 can decrease, and thus, third organic material solutions 114*a* to 114*c* dropped in each subpixel area P can be prevented from being mixed with third organic material solutions 114*a* to 114*c* dropped in each subpixel area P adjacent thereto in a horizontal direction.

Figure 13H:
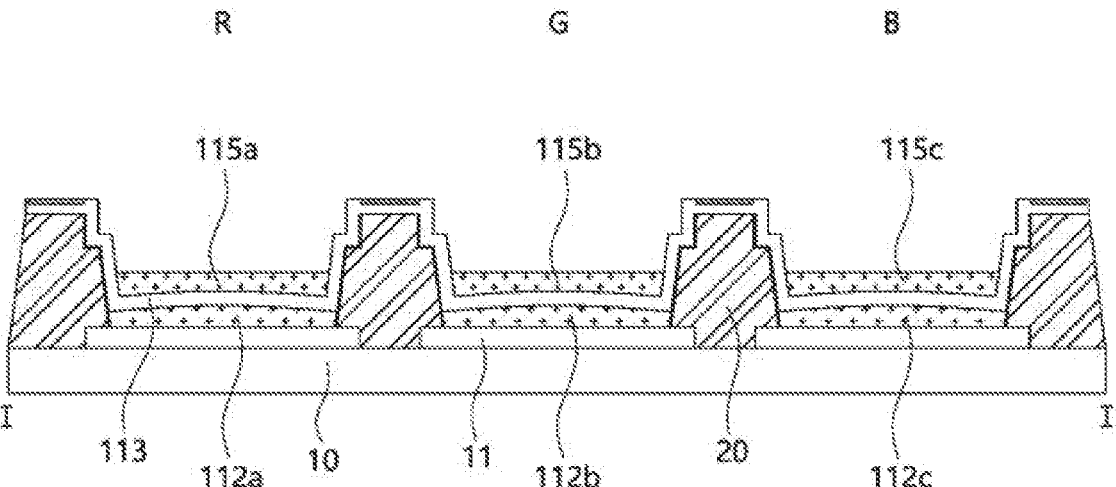

As illustrated in FIG. 13H, by performing a process of drying the dropped third organic material solutions 114*a* to 114*c*, a solvent of the third organic material solutions 114*a* to 114*c* can be vaporized and only a solute of the third organic material solutions 114*a* to 114*c* can remain on the second organic material layer 113, and thus, third organic material layers 115*a* to 115*c* can be formed on the second organic material layer 113.

The third organic material layers 115*a* to 115*c* can include the second hole transport layer (HTL2) and the second emission layer (EML2) illustrated in FIG. 11.

For example, a second hole transport material solution can be dropped on the second organic material layer 113 of each subpixel area P as the third organic material solutions 114*a* to 114*c*, and the second hole transport material solution can be dried, and thus, the second hole transport layer (HTL2) can be formed.

Moreover, a red emission material solution, a green emission material solution, and a blue emission material solution can be dropped on the second hole transport layer (HTL2) of each of the red subpixel area R, the green subpixel area G, and the blue subpixel area B as the third organic material solutions 114*a* to 114*c*, and the red emission material solution, the green emission material solution, and the blue emission material solution can be dried. And thus, a red emission layer, a green emission layer, and a blue emission layer can be formed.

Figure 13I:
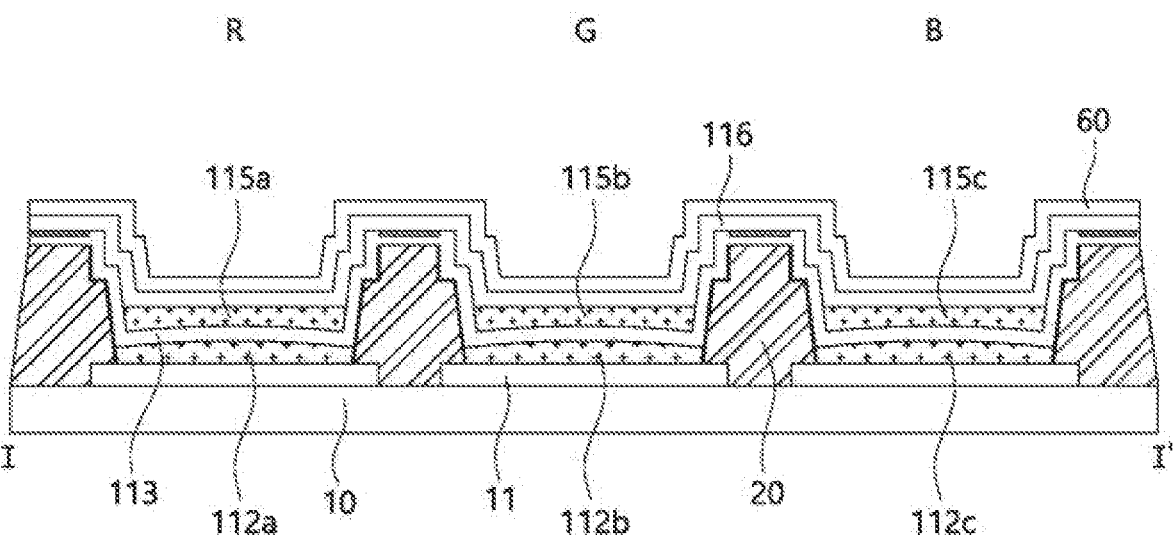

As illustrated in FIG. 13I, a fourth organic material layer 116 can be formed on the substrate 10 with third organic material layers 115*a* to 115*c* formed thereon by using a deposition process.

The fourth organic material layer 116 can include the second electron transport layer (ETL2) and the electron injection layer (EIL) illustrated in FIG. 11. Therefore, in FIG. 13I, the fourth organic material layer 116 is illustrated as a single layer, but is not limited thereto and can be formed of a multilayer.

Moreover, a second electrode 60 can be formed on the substrate 10 with the fourth organic material layer 116 formed thereon by using a deposition process.

Furthermore, in a light emitting device having a multi-stack structure, a pile-up effect can be removed by performing an inkjet printing process and a deposition process. Hereinafter, a manufacturing method for removing a pile-up effect in another example of a multi-stack structure will be described.

Figure 14:
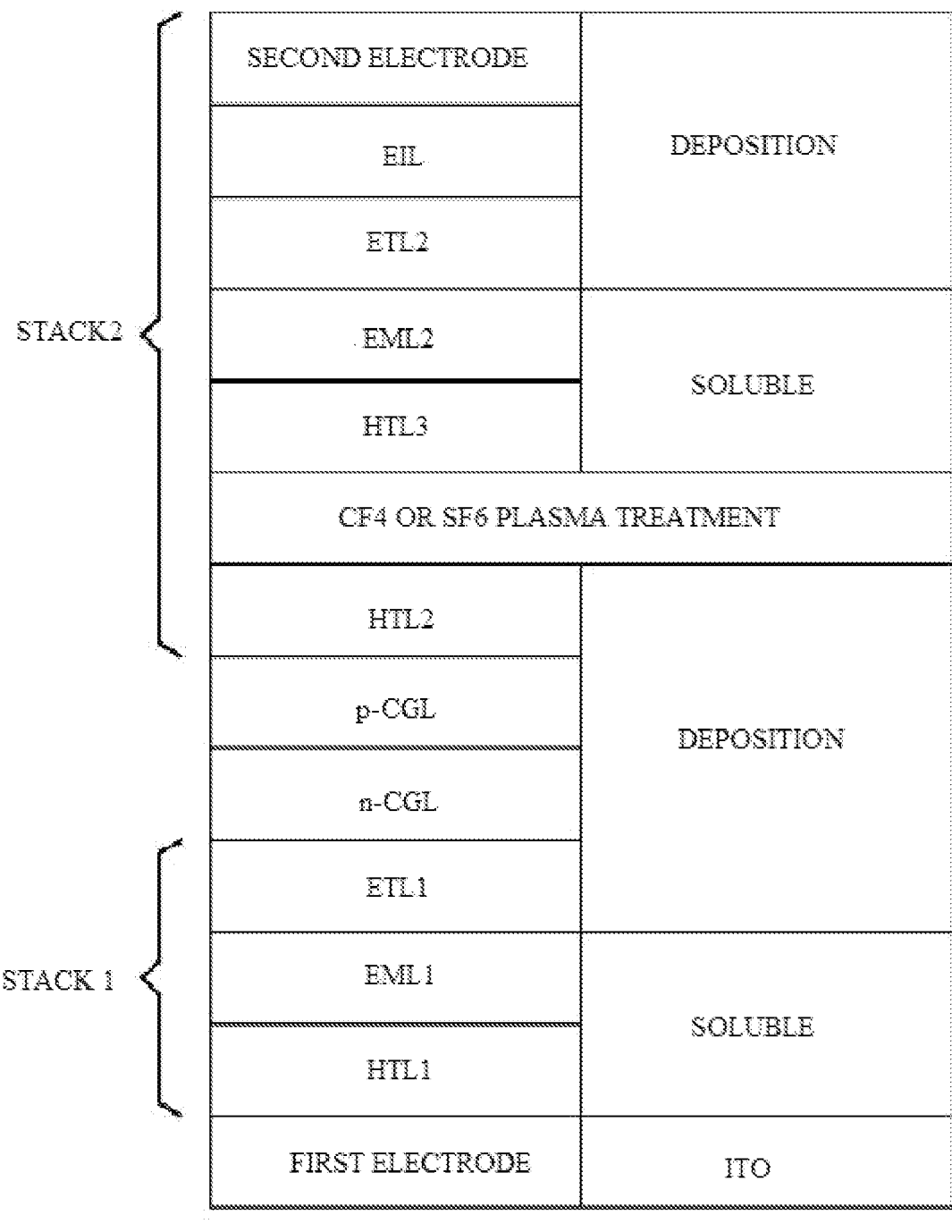
FIG. 14 is a structure diagram illustrating a process performed on each layer and a light emitting device having a multi-stack structure according to a fourth embodiment of the present disclosure.

FIG. 14 is a structure diagram illustrating a process performed on each layer and a light emitting device having a multi-stack structure according to a fourth embodiment of the present disclosure.

The light emitting device according to the fourth embodiment of the present disclosure, as illustrated in FIG. 14, can have a multi-stack structure where a first hole transport layer (HTL1), a first emission layer (EML1), a first electron transport layer (ETL1), an n-type charge generating layer (n-CGL), a p-type charge generating layer (p-CGL), a second hole transport layer (HTL2), a third hole transport layer (HTL3), a second emission layer (EML2), a second electron transport layer (ETL2), and an electron injection layer (EIL) are sequentially stacked between a first electrode (Anode; ITO) and a second electrode (Cathode; Metal).

Here, a first stack (Stack1) can include the first hole transport layer (HTL1), the first emission layer (EML1), and the first electron transport layer (ETL1), and a second stack (Stack2) can include the second hole transport layer (HTL2), the third hole transport layer (HTL3), the second emission layer (EML2), the second electron transport layer (ETL2), and the electron injection layer (EIL). Therefore, a charge generating layer (CGL) can be disposed between the first and second stacks.

The first hole transport layer (HTL1) and the first emission layer (EML1) can be formed by an inkjet printing process (a soluble process).

The first electron transport layer (ETL1), the n-type charge generating layer (n-CGL), the p-type charge generating layer (p-CGL), and the second hole transport layer (HTL2) can be formed by a deposition process.

The third hole transport layer (HTL3) and the second emission layer (EML2) can be formed by an inkjet printing process (a soluble process).

The second electron transport layer (ETL2), the electron injection layer (EIL), and the second electrode can be formed by a deposition process.

A structure of the organic light emitting display panel having the multi-stack structure according to the fourth embodiment of the present disclosure will be described below.

Figure 15:
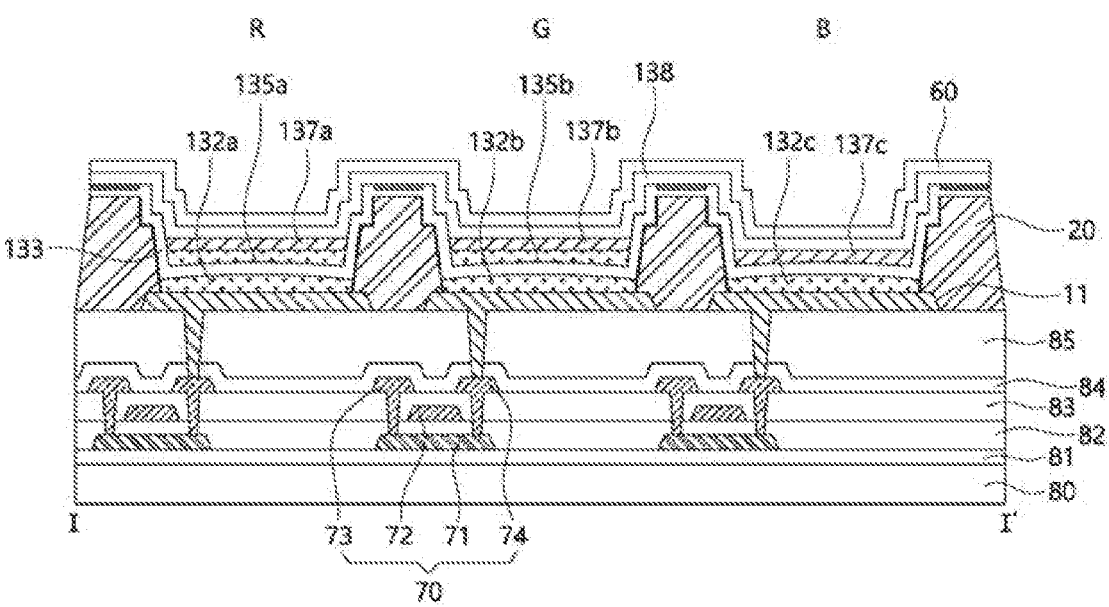
FIG. 15 is a structure cross-sectional view of an organic light emitting device according to the fourth embodiment of the present disclosure.

FIG. 15 is a structure cross-sectional view of an organic light emitting device according to the fourth embodiment of the present disclosure.

The organic light emitting device according to the fourth embodiment of the present disclosure, as illustrated in FIG. 15, can include a TFT 70 and an organic light emitting device, which are provided in each of a plurality of subpixel areas P on a substrate 80.

The substrate 80 can include an insulating material, and for example, the substrate 80 can include glass or a plastic material such as polyimide (PI).

A buffer layer 81 can be disposed on the substrate 80. The buffer layer 81 can include a single layer, including SiNx or SiOx which is an inorganic material, or a multilayer including SiNx and SiOx. However, the buffer layer 81 need not be an essential element and can be omitted based on the kind and material of the substrate 80 and a structure and a type of the TFT 70.

The TFT 70 can be disposed on the buffer layer 81. The TFT 70 can include an active layer 71, a gate electrode 72, a source electrode 73, and a drain electrode 74.

The active layer 71 of the TFT 70 can be disposed on the buffer layer 81, and a gate insulation layer 82 can be disposed on the active layer 71 and the buffer layer 81.

The active layer 71 can include a-Si, poly-Si, an oxide semiconductor, or an organic semiconductor.

The gate insulation layer 82 can include a single layer, including SiNx or SiOx which is an inorganic material, or a multilayer including SiNx and SiOx, but is not limited thereto.

A first contact hole, through which each of the source electrode 73 and the drain electrode 74 contacts the active layer 71, can be formed in the gate insulation layer 82.

The gate electrode 72 can be disposed on the gate insulation layer 82 to overlap the active layer 71. The gate electrode 72 can include conductive metal (for example, Cu, Al, Mo, or an alloy thereof), but is not limited thereto.

An interlayer insulation layer 83 can be disposed on the gate electrode 72 and the gate insulation layer 82. The interlayer insulation layer 83 can include a single layer, including SiNx or SiOx which is an inorganic material, or a multilayer including SiNx and SiOx, but is not limited thereto. A second contact hole, through which each of the source electrode 73 and the drain electrode 74 contacts the active layer 71, can be formed in the interlayer insulation layer 83.

The source electrode 73 and the drain electrode 74 can be disposed on the interlayer insulation layer 83. The source electrode 73 and the drain electrode 74 can include a conductive metal (for example, Cu, Al, Mo, or an alloy thereof), but are not limited thereto. Each of the source electrode 73 and the drain electrode 74 can be electrically connected to the active layer 71 through the first contact hole and the second contact hole.

A passivation layer 84 can be disposed on the TFT 70 and the interlayer insulation layer 83. The passivation layer 84 can include a single layer, including SiNx or SiOx which is an inorganic material, or a multilayer including SiNx and SiOx, but is not limited thereto.

A third contact hole for enabling a first electrode 11 of an OLED to be connected to the drain electrode 74 of the TFT 70 can be formed in the passivation layer 84. The passivation layer 84 need not be an essential element and can be omitted based on a design of the organic light emitting display panel.

A planarization layer 85 can be disposed on the passivation layer 84. The planarization layer 85 can include an organic material, and a fourth contact hole for exposing the drain electrode 74 of the TFT 70 can be formed in the planarization layer 85.

The first electrode 11 can be disposed in each subpixel area on the planarization layer 85, and the bank layer 20 can be disposed on the planarization layer 85 at a boundary portion between the subpixel areas P to overlap an edge of the first electrode 11.

An edge and a lateral surface of a top surface of the bank layer 20 in a vertical direction (a first direction) can be hydrophilic, and the top surface and the lateral surface of the bank layer 20 adjacent to each subpixel area in a horizontal direction (a second direction) can be hydrophilic.

A plurality of first organic material layers 132a to 132c can be disposed on the first electrode 11 between adjacent bank layers 20.

A second organic material layer 133 can be disposed on the first organic material layers 132a to 132c and the bank layer 20, and the second organic material layer 133 on the bank layer 20 can be, or become, hydrophobic optionally.

A plurality of third organic material layers 135a to 135b and 137a to 137c can be disposed on the second organic material layer 133 between adjacent bank layers 20, and a fourth organic material layer 138 can be disposed on the third organic material layers 135a to 135b and 137a to 137c and the second organic material layer 133 over the bank layer 20.

Moreover, a second electrode 60 can be disposed on the fourth organic material layer 138.

Here, the first organic material layers 132a to 132c can include a first hole transport layer (HTL1) and a first emission layer (EML1), and the second organic material layer 133 can include a first electron transport layer (ETL1), an n-type charge generating layer (n-CGL), a p-type charge generating layer (p-CGL), and a second hole transport layer (HTL2).

The third organic material layers 135a to 135b and 137a to 137c can include third hole transport layers 135a and 135b, formed in only in a red subpixel R and a green subpixel area G, and a red emission layer 137a, a green emission layer 137b, and a blue emission layer 137c respectively formed in the red subpixel R, the green subpixel area G, and a blue subpixel area B.

The fourth organic material layer 116 can include a second electron transport layer (ETL2) and an electron injection layer (EIL).

A method of manufacturing the light emitting device according to the fourth embodiment of the present disclosure for removing a pile-up effect in the light emitting device having the multi-stack structure will be described below.

FIGS. 16A to 16K are process cross-sectional views of an organic light emitting display panel taken along line I-I' of FIG. 1 according to the fourth embodiment of the present disclosure.

In FIGS. 16A to 16K, a process of forming a TFT 70 is not described and only a process of forming a light emitting device is illustrated. Therefore, a substrate 10 illustrated in FIGS. 16A to 16K can include all of the substrate 80, the TFT 70, and the planarization layer 85 illustrated in FIG. 15. Meanwhile, additional layers or structures can be optionally included in the substrate 10.

Figure 16A:
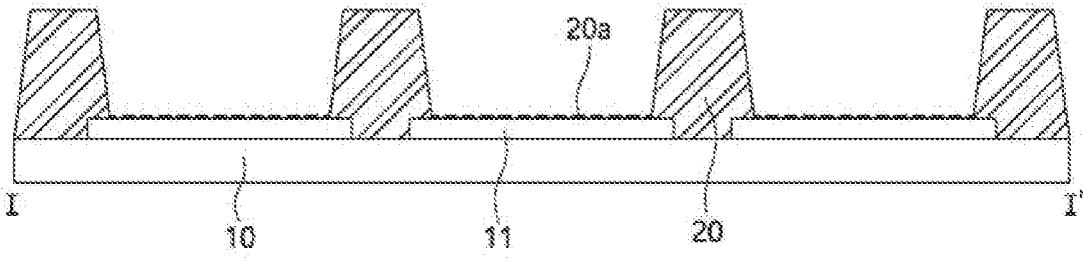
FIGS. 16A to 16K are process cross-sectional views of an organic light emitting display panel taken along line I-I' of FIG. 1 according to the fourth embodiment of the present disclosure.

As illustrated in FIG. 16A, a plurality of first electrodes 11 can be respectively formed in a plurality of subpixel areas P on a substrate 10.

Moreover, a hydrophobic organic insulating material can be coated on the substrate 10 with the first electrodes 11 formed thereon. By selectively removing the hydrophobic organic insulating material, a bank layer 20 having a lattice form can be formed at a boundary portion between adjacent subpixel areas.

Here, when the hydrophobic organic insulating material is selectively removed for forming the bank layer 20, an organic residual layer 20a can be on a surface of the first electrode 11.

Figure 16B:
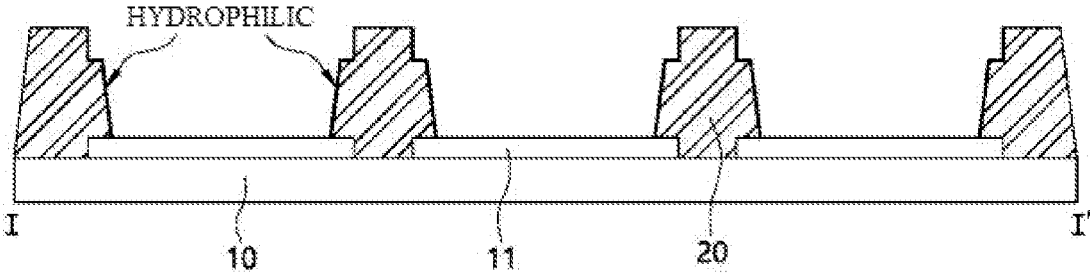

As illustrated in FIGS. 16B and 5B, by performing a plasma printing process on an upper edge and a lateral surface of the bank layer 20 in a vertical direction, a portion of each of the upper edge and the lateral surface of the bank layer 20 in a horizontal direction, and a surface of the first electrode 11, an organic residual layer 20a remaining in the surface of the first electrode 11 can be removed, and simultaneously, a portion of a top surface of the bank layer 20 and an edge and a lateral surface of the top surface can be hydrophilic.

This will be described in more detail.

The plasma printing process can use an $O_2/N_2/Ar$ gas, and the plasma printing process can be selectively performed by using a scan type. For example, in FIG. 1, a plasma printing direction is referred to by reference numeral "30".

The plasma printing process can be performed based on the scan type along vertical-direction subpixels to overlap edges of upper surfaces of two adjacent bank layers 20 in a vertical direction among a plurality of bank layers 20 having a lattice form.

Therefore, a step can be formed by removing, by a certain depth, edges of upper surfaces of two adjacent bank layers 20 in the vertical direction, and as illustrated in FIG. 5B, an upper surface of a bank layer 20 adjacent to a subpixel area in a horizontal direction among the plurality of bank layers 20 having a lattice form. Further, a portion, where a step is formed in the vertical direction, of the bank layer 20, a lateral surface of the bank layer 20 in the vertical layer, and an upper surface and a lateral surface of the bank layer 20 in the horizontal direction can be hydrophilic.

Figure 16C:
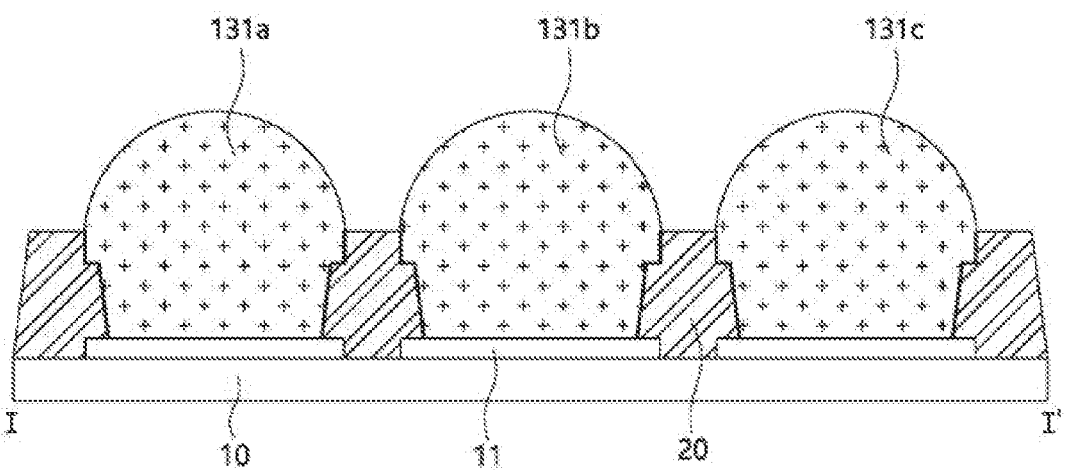

As illustrated in FIG. 16C, first organic material solutions 131a to 131c can be dropped on an upper portion of the first electrode 11 of each subpixel area P through an inkjet printing process (a soluble process).

At this time, because a top surface of the bank layer 20 has a hydrophobic characteristic, surface energy of the top surface of the bank layer 20 can decrease, and thus, first organic material solutions 131a to 131c dropped in each subpixel area P can be prevented from being mixed with first organic material solutions 131a to 131c dropped in each subpixel area P adjacent thereto in a horizontal direction.

Moreover, because an upper portion of the bank layer 20 in the horizontal direction is hydrophilic, the same first organic material solutions 131a to 131c can be dropped in each subpixel area P adjacent thereto in the vertical direction.

Figure 16D:
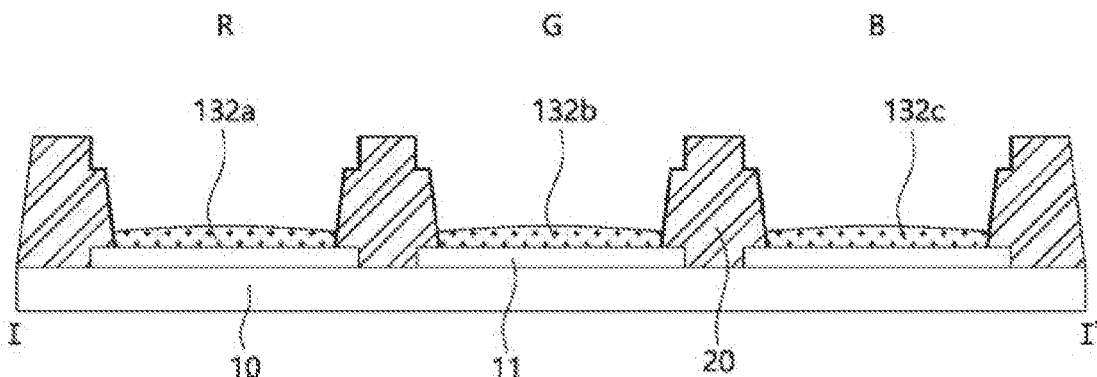

As illustrated in FIG. 16D, by performing a process of drying the dropped first organic material solutions 131a to 131c, a solvent of the first organic material solutions 131a to 131c can be vaporized and only a solute of the first organic material solutions 131a to 131c can remain on the first electrode 11, and thus, first organic material layers 132a to 132c can be formed on the first electrode 11.

Here, the first organic material layers 132a to 132c can include the first hole transport layer (HTL1) and the first emission layer (EML1) illustrated in FIG. 14.

Therefore, in FIG. 16D, each of the first organic material layers 132a to 132c is illustrated as a single layer, but is not limited thereto and can be formed of a multilayer.

For example, when the first organic material layers 132a to 132c include the first hole transport layer (HTL1) and the first emission layer (EML1), the following process can be performed.

As described above with reference to FIGS. 16C and 16D, a hole transport material solution can be dropped on the first electrode 11 of each subpixel area P and can be dried, and thus, the first hole transport layer (HTL1) can be formed on the first electrode 11.

When it is assumed that each subpixel area P includes a red subpixel area R, a green subpixel area G, and a blue subpixel area B, a red emission material solution, a green emission material solution, and a blue emission material solution can be dropped on a first hole transport layer (HTL1) of each of the red subpixel area R, the green subpixel area G, and the blue subpixel area B, and a red emission layer, a green emission layer, and a blue emission layer can be formed by drying the dropped red emission material solution, green emission material solution, and blue emission material solution.

Figure 16E:
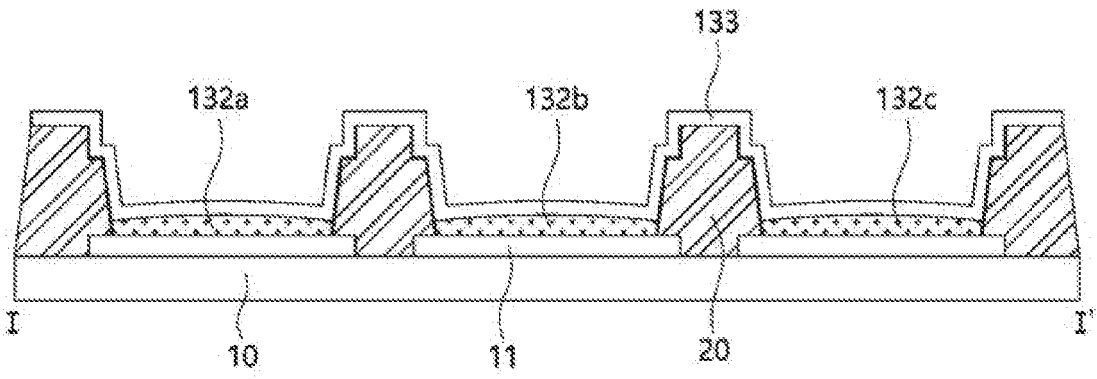

As illustrated in FIG. 16E, a second organic material layer 133 can be formed on a whole surface of the substrate 10 including the first organic material layers 132a to 132c and the bank layer 20 by using a deposition process.

The second organic material layer 133 can include a first electron transport layer (ETL1), an n-type charge generating layer (n-CGL), a p-type charge generating layer (p-CGL), and a second hole transport layer (HTL2) illustrated in FIG. 14.

For example, the first electron transport layer (ETL1), the n-type charge generating layer (n-CGL), the p-type charge generating layer (p-CGL), and the second hole transport layer (HTL2) can be sequentially deposited on the whole surface of the substrate 10 including the first organic material layers 132a to 132c and the bank layer 20.

Therefore, in FIG. 16E, the second organic material layer 133 is illustrated as a single layer, but is not limited thereto and can be formed of a multilayer including the first electron transport layer (ETL1), the n-type charge generating layer (n-CGL), the p-type charge generating layer (p-CGL), and the second hole transport layer (HTL2).

Figure 16F:
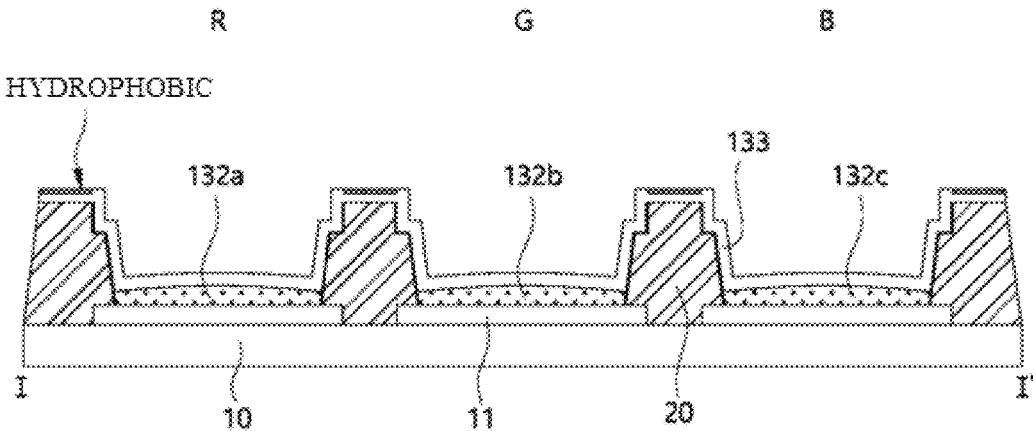

As illustrated in FIG. 16F, $CF_4$ or $SF_6$ gas plasma treatment can be performed on a surface of the second organic material layer 133 on the bank layer 20, and thus, a surface of the second organic material layer 133 on the bank layer 20 can be hydrophobic.

For example, $CF_4$ or $SF_6$ gas plasma treatment can be performed on a surface, disposed on the bank layer 20, of the second hole transport layer (HTL2) formed at an uppermost portion in the second organic material layer 133, and thus, the surface of the second hole transport layer (HTL2) on the bank layer 20 can be hydrophobic.

A detailed hydrophobic plasma treatment method has been described above with reference to FIGS. 6 and 7, and thus, is omitted.

Figure 16G:
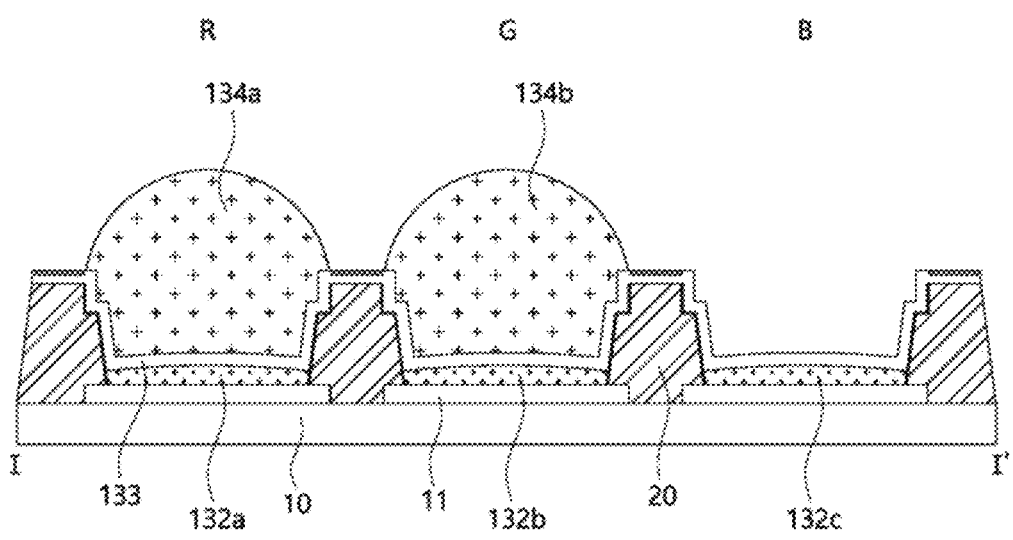

As illustrated in FIG. 16G, when it is assumed that each subpixel area P includes a red subpixel area R, a green subpixel area G, and a blue subpixel area B, third hole transport material solutions 134a and 134b can be dropped on only the second organic material layer 133 of each of the red subpixel area R and the green subpixel area G, and a third hole transport material solution need not be dropped on the blue subpixel area B.

Figure 16H:
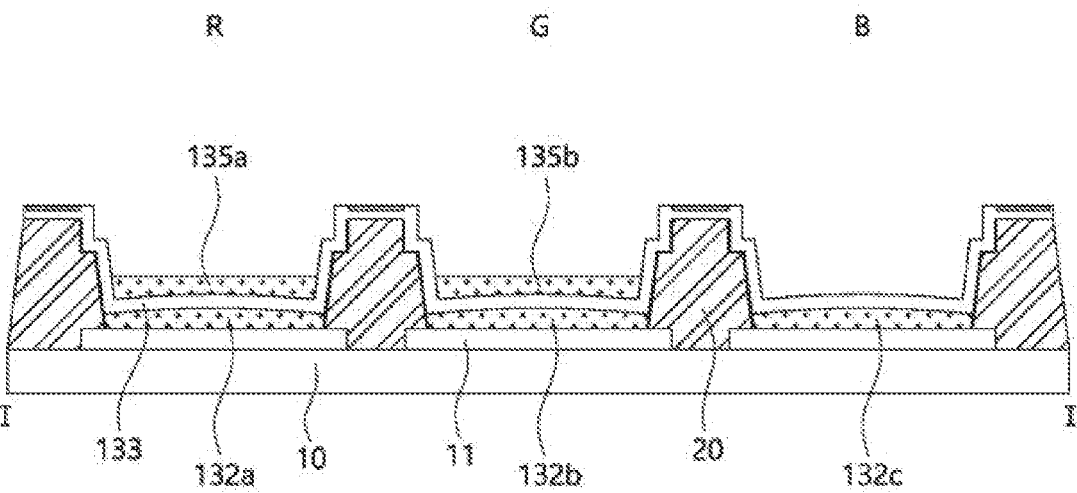

As illustrated in FIG. 16H, a process of drying the dropped third hole transport material solutions 134a and 134b can be performed.

For example, a solvent of the third hole transport material solutions 134a and 134b can be vaporized and only a solute of the third hole transport material solutions 134a and 134b can remain on the second organic material layer 133.

Therefore, third hole transport layers 135a and 135b can be formed on the second organic material layer 133 of each of the red subpixel area R and the green subpixel area G. A third hole transport layer need not be formed in the blue subpixel area B.

Figure 16I:
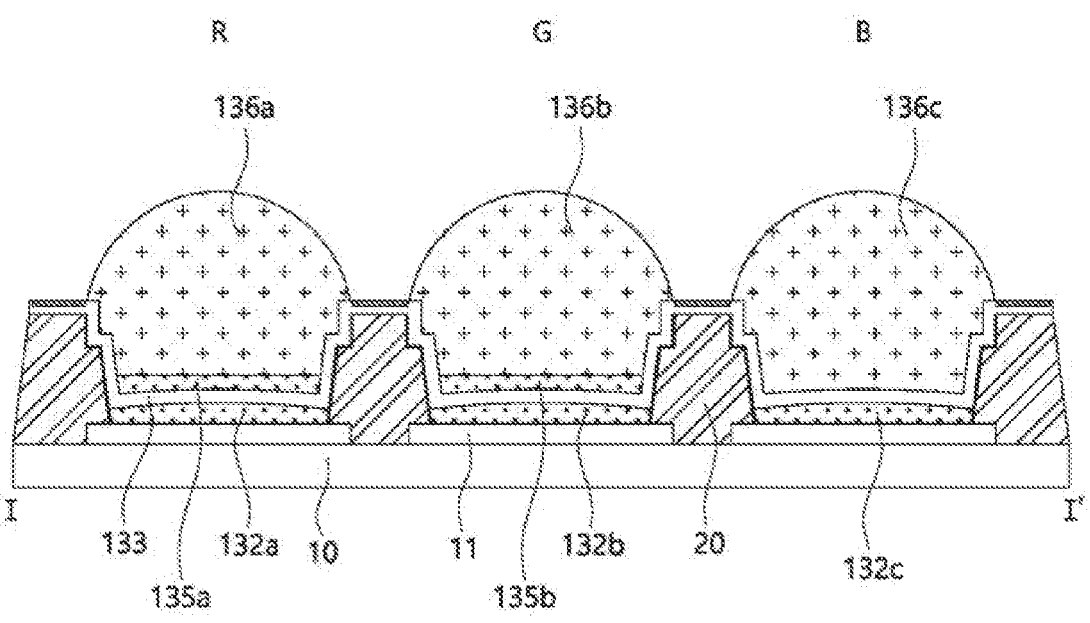

As illustrated in FIG. 16I, a red emission material solution 136a, a green emission material solution 136b, and a blue emission material solution 136c can be respectively dropped on the red subpixel area R, the green subpixel area G, and the blue subpixel area B.

Figure 16J:
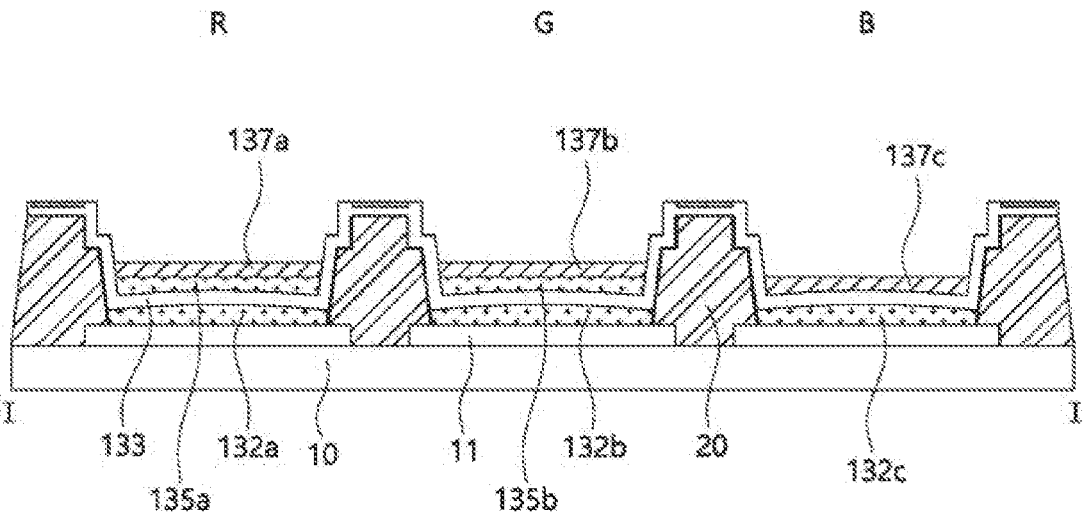

As illustrated in FIG. 16J, by performing a process of drying the dropped red emission material solution 136a, green emission material solution 136b, and blue emission material solution 136c, a red emission layer 137a, a green emission layer 137b, and a blue emission layer 137c can be respectively formed in the red subpixel area R, the green subpixel area G, and the blue subpixel area B.

Here, the third hole transport layers 135a and 135b, the red emission layer 137a, the green emission layer 137b, and the blue emission layer 137c can be referred to as a third organic material layer.

Therefore, as described above with reference to FIGS. 16E to 16J, the first, second, and third hole transport layers (HTL1, HTL2, HTL3) are formed in the red sub-pixel region (R), and the green sub-pixel region (G), but only the first hole transport layer (HTL1) and the second hole transport layer (HTL2) are is-formed in the blue sub-pixel region (B), so the pile-up effect can be excluded.

Figure 16K:
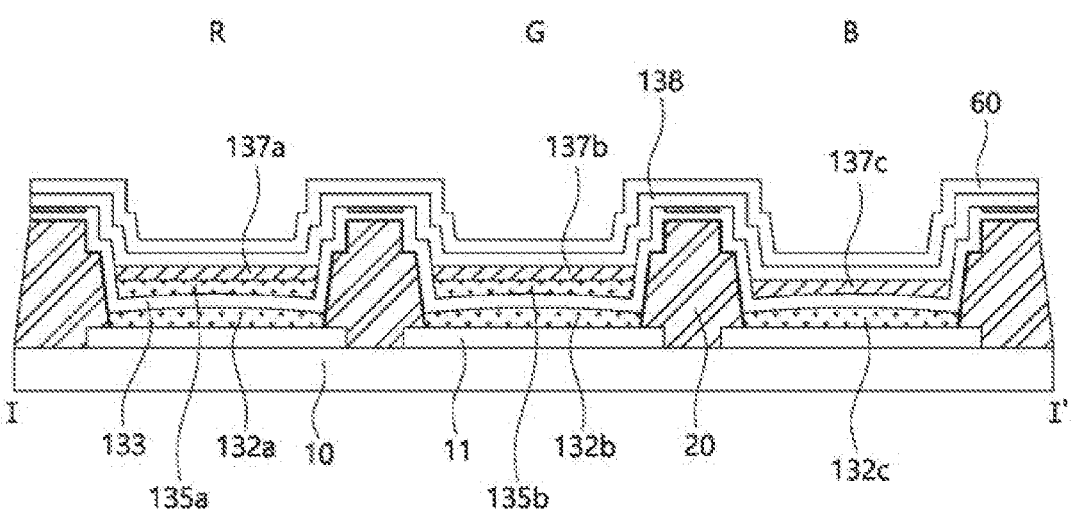

As illustrated in FIG. 16K, a fourth organic material layer 138 can be formed on the substrate 10 with the red emission layer 137a, the green emission layer 137b, and the blue emission layer 137c formed thereon by using a deposition process.

The fourth organic material layer 138 can include the second electron transport layer (ETL2) and the electron injection layer (EIL) illustrated in FIG. 14. Therefore, in FIG. 16K, the fourth organic material layer 138 is illustrated as a single layer, but is not limited thereto and can be formed of a multilayer.

Moreover, a second electrode 60 can be formed on the substrate 10 with the fourth organic material layer 138 formed thereon by using a deposition process.

Furthermore, in a light emitting device having a multi-stack structure, an inkjet printing process and a deposition process can be performed, but a pile-up effect can be removed by performing the order of the inkjet printing process and the deposition process. Hereinafter, a structure of an organic light emitting display panel and a method of manufacturing the organic light emitting display panel for removing a pile-up effect by changing the order of the inkjet printing process and the deposition process will be described.

FIG. 17 is a structure diagram illustrating a process performed on each layer and a light emitting device having a multi-stack structure according to a fifth embodiment of the present disclosure.

The light emitting device according to the fifth embodiment of the present disclosure, as illustrated in FIG. 17, can have a multi-stack structure where a first hole transport layer (HTL1), a first emission layer (EML1), a first electron transport layer (ETL1), an n-type charge generating layer (n-CGL), a p-type charge generating layer (p-CGL), a second hole transport layer (HTL2), a third hole transport layer (HTL3), a second emission layer (EML2), a second electron transport layer (ETL2), and an electron injection layer (EIL) are sequentially stacked between a first electrode (Anode; ITO) and a second electrode (Cathode; Metal).

Here, a first stack (Stack1) can include the first hole transport layer (HTL1), the first emission layer (EML1), and the first electron transport layer (ETL1), and a second stack (Stack2) can include the second hole transport layer (HTL2), the third hole transport layer (HTL3), the second emission layer (EML2), the second electron transport layer (ETL2), and the electron injection layer (EIL). Therefore, a charge generating layer can be disposed between the first and second stacks.

The first hole transport layer (HTL1) can be formed by a deposition process, and the first emission layer (EML1) can be formed by an inkjet printing process (a soluble process).

The first electron transport layer (ETL1), the n-type charge generating layer (n-CGL), the p-type charge generating layer (p-CGL), and the second hole transport layer (HTL2) can be formed by a deposition process.

The third hole transport layer (HTL3) and the second emission layer (EML2) can be formed by an inkjet printing process (a soluble process).

The second electron transport layer (ETL2), the electron injection layer (EIL), and the second electrode can be formed by a deposition process.

A structure of the organic light emitting display panel according to the fifth embodiment of the present disclosure for removing a pile-up effect in a light emitting device having the multi-stack structure will be described below.

Figure 18:
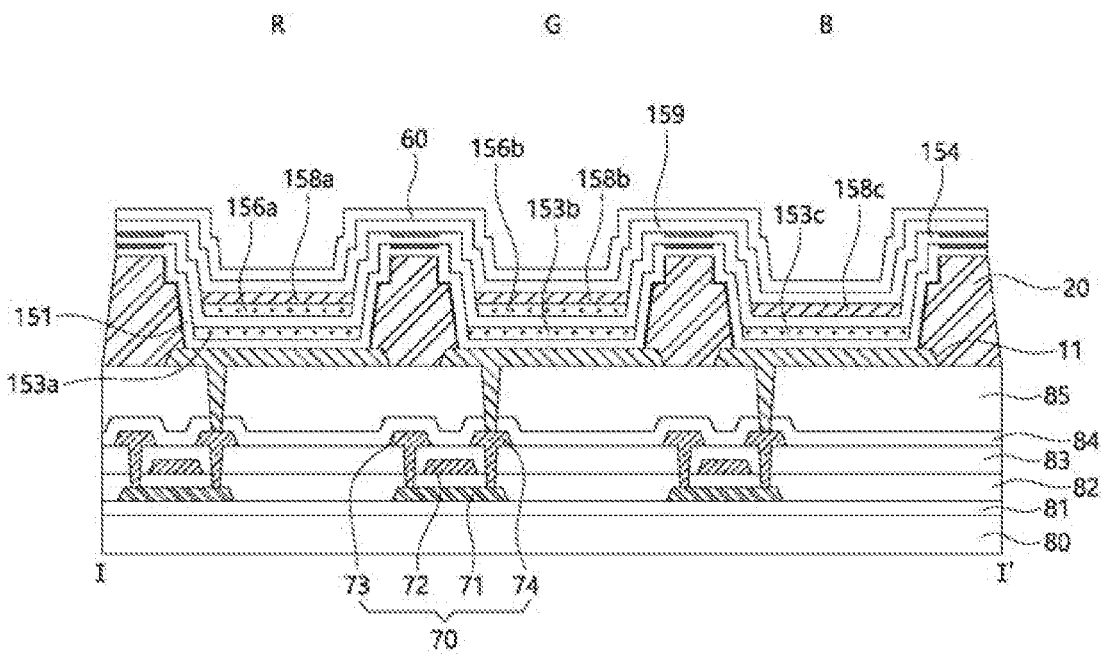
FIG. 18 is a structure cross-sectional view of an organic light emitting device according to a fifth embodiment of the present disclosure.

FIG. 18 is a structure cross-sectional view of an organic light emitting device according to the fifth embodiment of the present disclosure.

The organic light emitting device according to the fifth embodiment of the present disclosure, as illustrated in FIG. 18, can include a TFT 70 and an organic light emitting device, which are provided in each of a plurality of subpixel areas P on a substrate 80.

The substrate 80 can include an insulating material, and for example, the substrate 80 can include glass or a plastic material such as polyimide (PI).

A buffer layer 81 can be disposed on the substrate 80. The buffer layer 81 can include a single layer, including SiNx or SiOx which is an inorganic material, or a multilayer including SiNx and SiOx. However, the buffer layer 81 need not be an essential element and can be omitted based on the kind and material of the substrate 80 and a structure and a type of the TFT 70.

The TFT 70 can be disposed on the buffer layer 81. The TFT 70 can include an active layer 71, a gate electrode 72, a source electrode 73, and a drain electrode 74.

The active layer 71 of the TFT 70 can be disposed on the buffer layer 81, and a gate insulation layer 82 can be disposed on the active layer 71 and the buffer layer 81.

The active layer 71 can include a-Si, poly-Si, an oxide semiconductor, or an organic semiconductor.

The gate insulation layer 82 can include a single layer, including SiNx or SiOx which is an inorganic material, or a multilayer including SiNx and SiOx, but is not limited thereto.

A first contact hole, through which each of the source electrode 73 and the drain electrode 74 contacts the active layer 71, can be formed in the gate insulation layer 82.

The gate electrode 72 can be disposed on the gate insulation layer 82 to overlap the active layer 71. The gate electrode 72 can include conductive metal (for example, Cu, Al, Mo, or an alloy thereof), but is not limited thereto.

An interlayer insulation layer 83 can be disposed on the gate electrode 72 and the gate insulation layer 82. The interlayer insulation layer 83 can include a single layer, including SiNx or SiOx which is an inorganic material, or a multilayer including SiNx and SiOx, but is not limited thereto. A second contact hole, through which each of the source electrode 73 and the drain electrode 74 contacts the active layer 71, can be formed in the interlayer insulation layer 83.

The source electrode 73 and the drain electrode 74 can be disposed on the interlayer insulation layer 83. The source electrode 73 and the drain electrode 74 can include conductive metal (for example, Cu, Al, Mo, or an alloy thereof), but are not limited thereto. Each of the source electrode 73 and the drain electrode 74 can be electrically connected to the active layer 71 through the first contact hole and the second contact hole.

A passivation layer 84 can be disposed on the TFT 70 and the interlayer insulation layer 83. The passivation layer 84 can include a single layer, including SiNx or SiOx which is an inorganic material, or a multilayer including SiNx and SiOx, but is not limited thereto.

A third contact hole for enabling a first electrode 11 of an OLED to be connected to the drain electrode 74 of the TFT 70 can be formed in the passivation layer 84. The passivation layer 84 need not be an essential element and can be omitted based on a design of the organic light emitting display panel.

A planarization layer 85 can be disposed on the passivation layer 84. The planarization layer 85 can include an organic material, and a fourth contact hole for exposing the drain electrode 74 of the TFT 70 can be formed in the planarization layer 85.

The first electrode 11 can be disposed in each subpixel area on the planarization layer 85, and the bank layer 20 can be disposed on the planarization layer 85 at a boundary portion between the subpixel areas P to overlap an edge of the first electrode 11.

A first organic material layer 151 can be disposed on the first electrode 11 and the bank layer 20, and the first organic material layer 151 on the bank layer 20 can be, or become, hydrophobic optionally.

A plurality of second organic material layers 153a to 153c can be disposed on the first organic material layer 151 between adjacent bank layers 20.

A third organic material layer 154 can be disposed on the second organic material layers 153a to 153c and the first organic material layer 151, and the third organic material layer 154 on the bank layer 20 can be, or become, hydrophobic optionally.

Fourth organic material layers 156a to 156c and 158a to 158c can be disposed on the third organic material layer 154 between adjacent bank layers 20, and a fifth organic material layer 159 can be disposed on the fourth organic material layers 156a to 156c and 158a to 158c and the third organic material layer 154 over the bank layer 20.

Moreover, a second electrode 60 can be disposed on the fifth organic material layer 159.

Here, the first organic material layer 151 can include a first hole transport layer (HTL1), and the second organic material layers 153a to 153c can include a first emission layer (EML1).

The third organic material layer 154 can include a first electron transport layer (ETL1), an n-type charge generating layer (n-CGL), a p-type charge generating layer (p-CGL), and a second hole transport layer (HTL2).

The fourth organic material layers 156a to 156b and 158a to 158c can include third hole transport layers 156a and 156b formed in only in a red subpixel R and a green subpixel area G, and a second emission layer which includes a red emission layer 158a, a green emission layer 158b, and a blue emission layer 158c respectively formed in the red subpixel R, the green subpixel area G, and a blue subpixel area B.

The fifth organic material layer 159 can include a second electron transport layer (ETL2) and an electron injection layer (EIL).

A method of manufacturing the light emitting device according to the fifth embodiment of the present disclosure for removing a pile-up effect in the light emitting device having the multi-stack structure will be described below.

FIGS. 19A to 19M are process cross-sectional views of an organic light emitting display panel taken along line I-I' of FIG. 1 according to the fifth embodiment of the present disclosure.

In FIGS. 19A to 19K, a process of forming a TFT 70 is not described and only a process of forming a light emitting device is illustrated. Therefore, a substrate 10 illustrated in FIGS. 19A to 19M can include all of the substrate 80, the TFT 70, and the planarization layer 85 illustrated in FIG. 18. Meanwhile, additional layers or structures can be optionally included in the substrate 10.

Figure 19A:
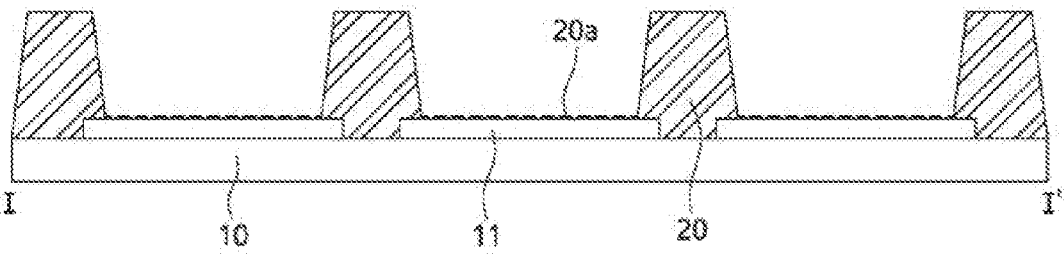
FIGS. 19A to 19M are process cross-sectional views of an organic light emitting display panel taken along line I-I' of FIG. 1 according to the fifth embodiment of the present disclosure.

As illustrated in FIG. 19A, a plurality of first electrodes 11 can be respectively formed in a plurality of subpixel areas P on a substrate 10.

Moreover, a hydrophobic organic insulating material can be coated on the substrate 10 with the first electrodes 11 formed thereon. By selectively removing the hydrophobic organic insulating material, a bank layer 20 having a lattice form can be formed at a boundary portion between adjacent subpixel areas.

Here, when the hydrophobic organic insulating material is selectively removed for forming the bank layer 20, an organic residual layer 20a can be on a surface of the first electrode 11.

Figure 19B:
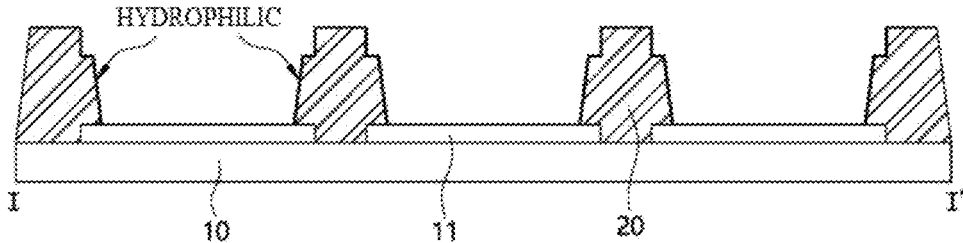

As illustrated in FIGS. 19B and 5B, by performing a plasma printing process on an upper edge and a lateral surface of the bank layer 20 in a vertical direction, a portion of each of the upper edge and the lateral surface of the bank layer 20 in a horizontal direction, and a surface of the first electrode 11, an organic residual layer 20a remaining in the surface of the first electrode 11 can be removed, and simultaneously, a portion of a top surface of the bank layer 20 and an edge and a lateral surface of the top surface can be hydrophilic.

This will be described in more detail.

The plasma printing process can use an $O_2/N_2/Ar$ gas, and the plasma printing process can be selectively performed by using a scan type. For example, in FIG. 1, a plasma printing direction is referred to by reference numeral "30".

The plasma printing process can be performed based on the scan type along vertical-direction subpixels to overlap edges of upper surfaces of two adjacent bank layers 20 in a vertical direction among a plurality of bank layers 20 having a lattice form.

Therefore, a step can be formed by removing, by a certain depth, edges of upper surfaces of two adjacent bank layers 20 in the vertical direction, and as illustrated in FIG. 5B, an upper surface of a bank layer 20 adjacent to a subpixel area in a horizontal direction among the plurality of bank layers 20 having a lattice form. Further, a portion, where a step is formed in the vertical direction, of the bank layer 20, a lateral surface of the bank layer 20 in the vertical layer, and an upper surface and a lateral surface of the bank layer 20 in the horizontal direction can be hydrophilic.

Figure 19C:
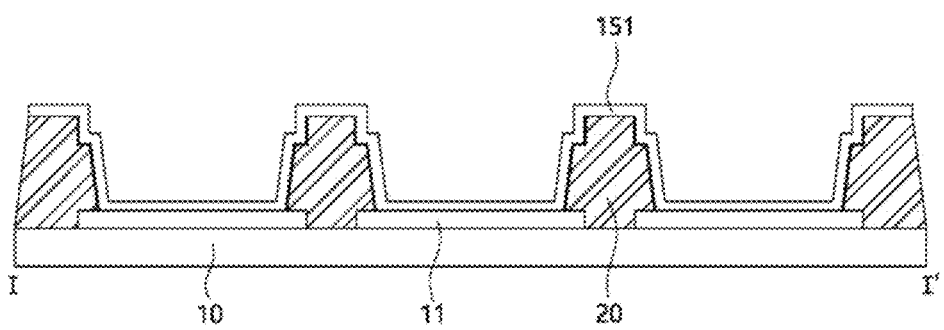

As illustrated in FIG. 19C, a first organic material layer 151 can be formed on a whole surface of the substrate 10 including the first electrode 11 and the bank layer 20 by using a deposition process.

The first organic material layer 151 can include the first electron transport layer (ETL1) illustrated in FIG. 17.

Figure 19D:
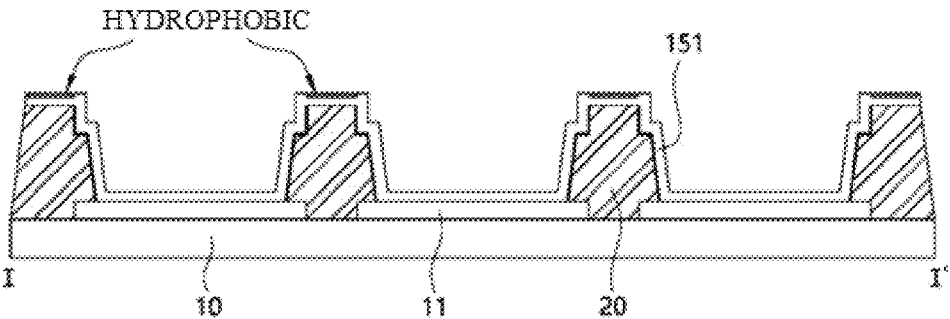

As illustrated in FIG. 19D, $CF_4$ or $SF_6$ gas plasma treatment can be performed on a surface of the first organic material layer 151 on the bank layer 20, and thus, a surface of the first organic material layer 151 on the bank layer 20 can be hydrophobic.

A detailed hydrophobic plasma treatment method has been described above with reference to FIGS. 6 and 7, and thus, is omitted.

Figure 19E:
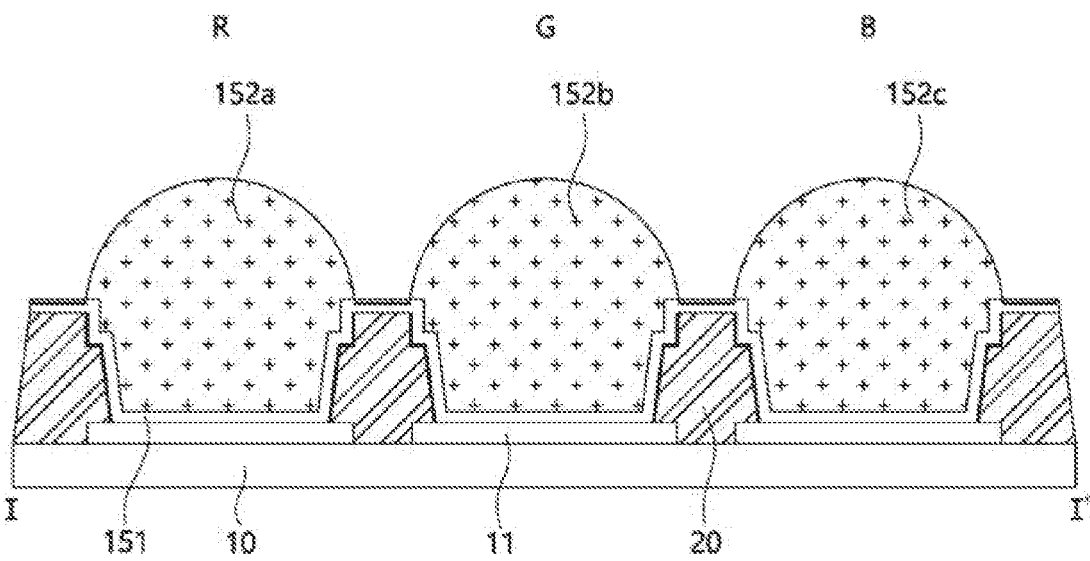

As illustrated in FIG. 19E, a red emission material solution 152a, a green emission material solution 152b, and a blue emission material solution 152c can be respectively dropped on the red subpixel area R, the green subpixel area G, and the blue subpixel area B through an inkjet printing process (a soluble process).

At this time, because a top surface of the first organic material layer 151 on the bank layer 20 in a vertical direction has a hydrophobic characteristic, the red emission material solution 152a, the green emission material solution 152b, and the blue emission material solution 152c dropped on each of subpixel areas P adjacent to each other in a horizontal direction need not be mixed with one another.

Moreover, because the top surface of the first organic material layer 151 on the bank layer 20 in the horizontal direction is not hydrophobic, the same red emission material solution 152a, green emission material solution 152b, and blue emission material solution 152c can be dropped on each of subpixel areas P adjacent to each other in the vertical direction.

Figure 19F:
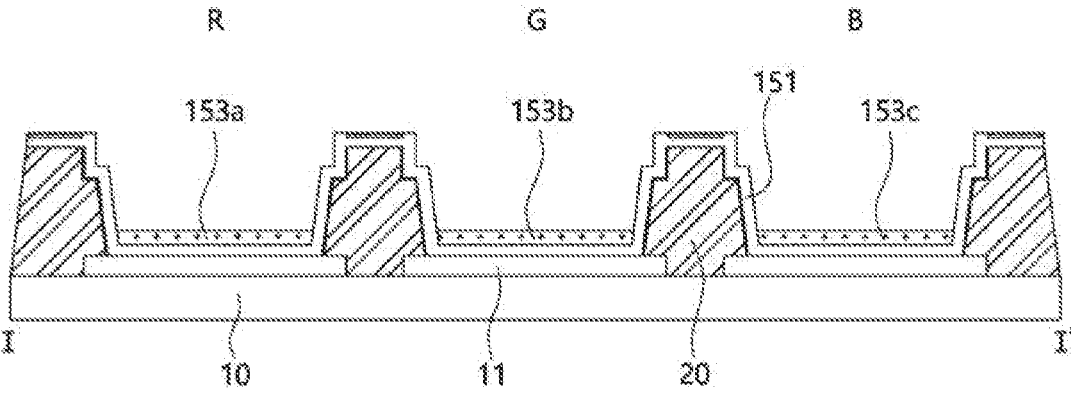

As illustrated in FIG. 19F, a process of drying the dropped red emission material solution 152a, green emission material solution 152b, and blue emission material solution 152c can be performed.

For example, a solvent of the dropped red emission material solution 152a, green emission material solution 152b, and blue emission material solution 152c can be vaporized, and only a solute of the red emission material solution 152a, the green emission material solution 152b, and the blue emission material solution 152c can remain on the first organic material layer 151.

Therefore, a red emission layer 153a, a green emission layer 153b, and a blue emission layer 153c can be formed on the first organic material layer 151.

Here, the red emission layer 153a, the green emission layer 153b, and the blue emission layer 153c can be referred to as a second organic material layer.

Figure 19G:
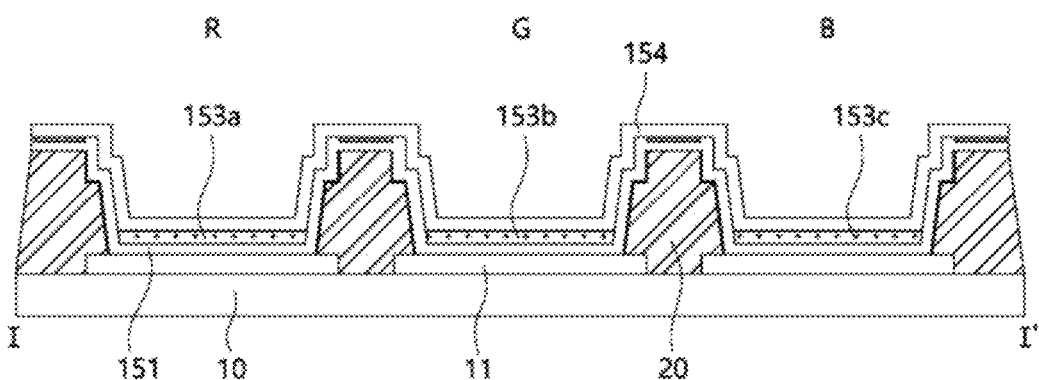

As illustrated in FIG. 19G, a third organic material layer 154 can be formed on a whole surface of the substrate 10 including the second organic material layers 153a to 153c and the first organic material layer 151 by using a deposition process.

The third organic material layer 154 can include a first electron transport layer (ETL1), an n-type charge generating layer (n-CGL), a p-type charge generating layer (p-CGL), and a second hole transport layer (HTL2) illustrated in FIG. 17.

For example, the first electron transport layer (ETL1), the n-type charge generating layer (n-CGL), the p-type charge generating layer (p-CGL), and the second hole transport layer (HTL2) can be sequentially deposited on the whole surface of the substrate 10 including the second organic material layers 153a to 153c and the first organic material layer 151.

Therefore, in FIG. 19G, the third organic material layer 154 is illustrated as a single layer, but is not limited thereto and can be formed of a multilayer including the first electron transport layer (ETL1), the n-type charge generating layer (n-CGL), the p-type charge generating layer (p-CGL), and the second hole transport layer (HTL2).

Figure 19H:
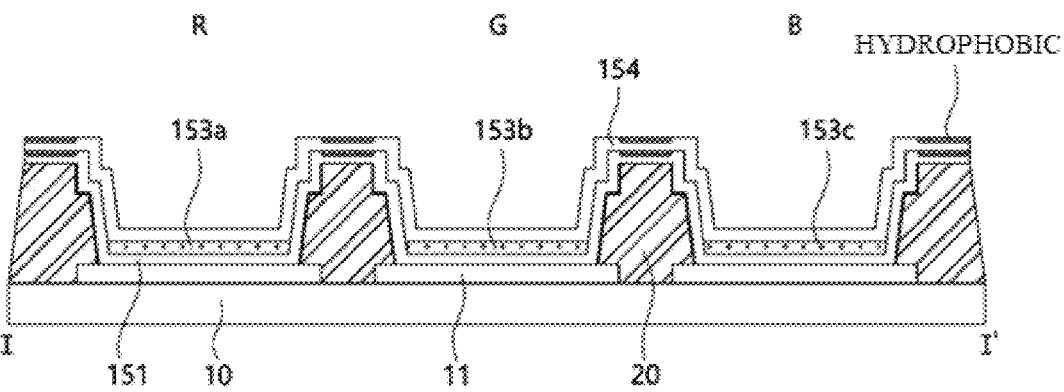

As illustrated in FIG. 19H, CF$_4$ or SF$_6$ gas plasma treatment can be performed on a surface of the third organic material layer 154 on the bank layer 20, and thus, a surface of the third organic material layer 154 on the bank layer 20 can be hydrophobic.

For example, CF$_4$ or SF$_6$ gas plasma treatment can be performed on a surface, disposed on the bank layer 20, of the second hole transport layer (HTL2) formed at an uppermost portion in the third organic material layer 154, and thus, the surface of the second hole transport layer (HTL2) on the bank layer 20 can be hydrophobic.

A detailed hydrophobic plasma treatment method has been described above with reference to FIGS. 6 and 7, and thus, is omitted.

Figure 19I:
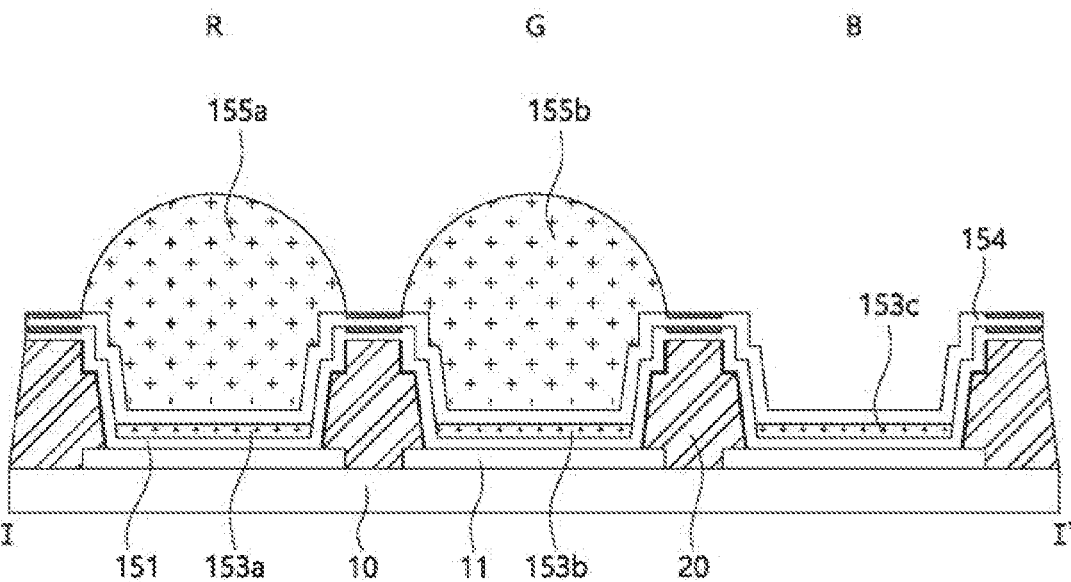

As illustrated in FIG. 19I, when each subpixel area P includes a red subpixel area R, a green subpixel area G, and a blue subpixel area B, third hole transport material solutions 155a and 155b can be dropped on only the third organic material layer 154 of each of the red subpixel area R and the green subpixel area G, and a third hole transport material solution need not be dropped on the blue subpixel area B.

Figure 19J:
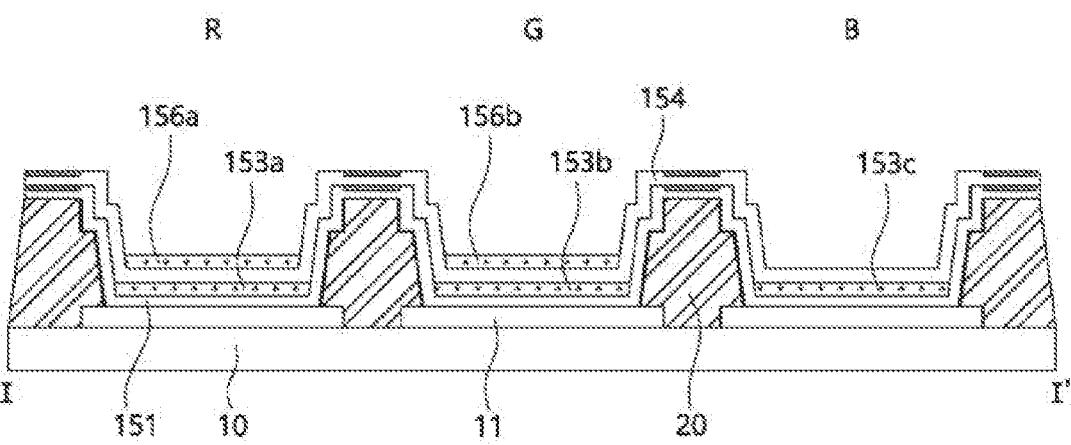

As illustrated in FIG. 19J, by performing a process of drying the dropped third hole transport material solutions 155a and 155b, third hole transport layers 156a and 156b can be formed on the third organic material layer 154 of each of the red subpixel area R and the green subpixel area G. A third hole transport layer need not be formed in the blue subpixel area B.

Figure 19K:
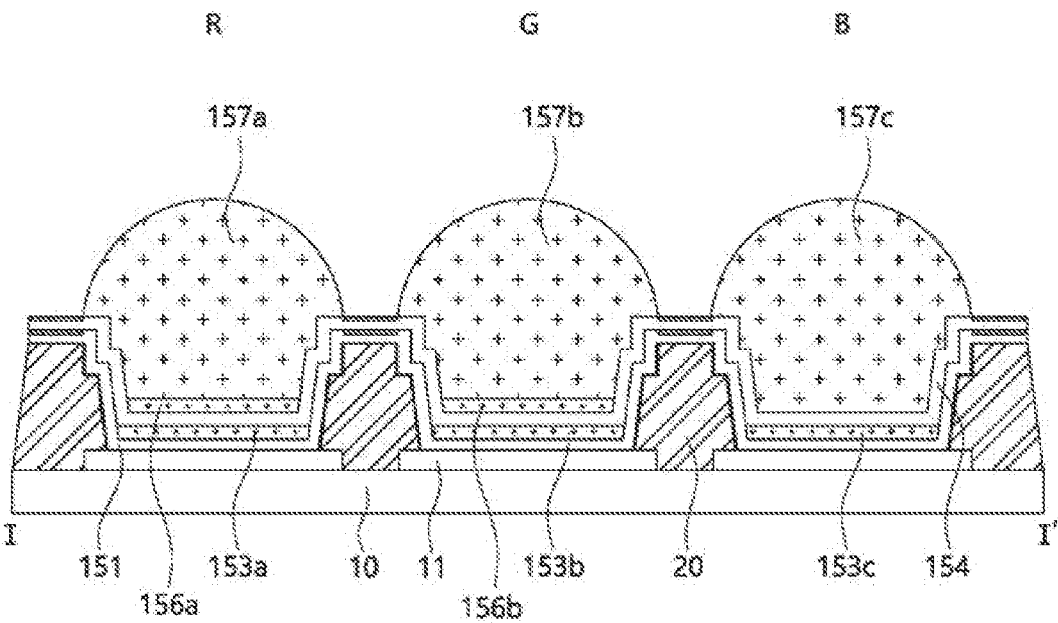

As illustrated in FIG. 19K, a red emission material solution 157a, a green emission material solution 157b, and a blue emission material solution 157c can be respectively dropped on the red subpixel area R, the green subpixel area G, and the blue subpixel area B.

Figure 19L:
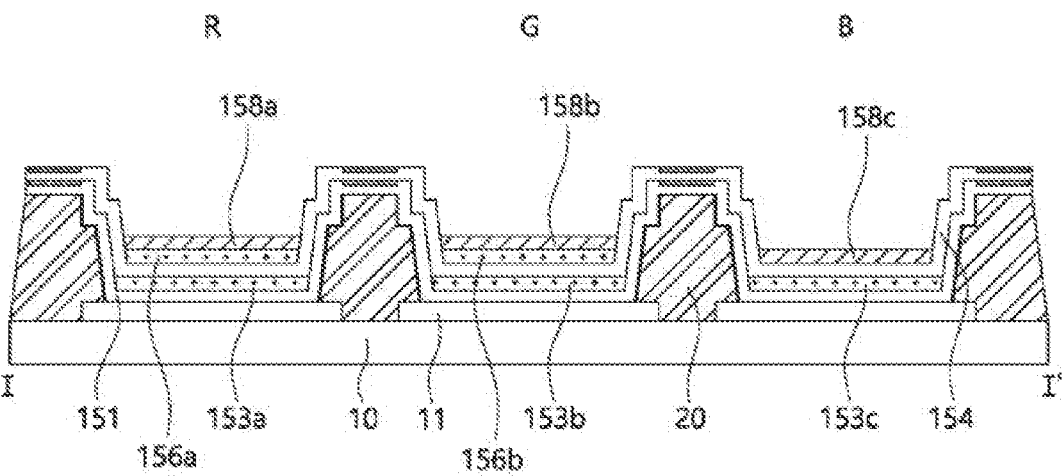

As illustrated in FIG. 19L, by performing a process of drying the dropped red emission material solution 157a, green emission material solution 157b, and blue emission material solution 157c, a red emission layer 158a, a green emission layer 158b, and a blue emission layer 158c can be respectively formed in the red subpixel area R, the green subpixel area G, and the blue subpixel area B.

Here, the third hole transport layers 156a and 156b, the red emission layer 158a, the green emission layer 158b, and the blue emission layer 158c can be referred to as a fourth organic material layer.

Therefore, as described above with reference to FIGS. 19I to 19L, the third hole transport layers 156a and 156b, the red emission layer 158a, and the green emission layer 158b can be formed in the red subpixel area R and the green subpixel area G, but only the blue emission layer 158c can be formed in the blue subpixel area B, thereby removing a pile-up effect.

Figure 19M:
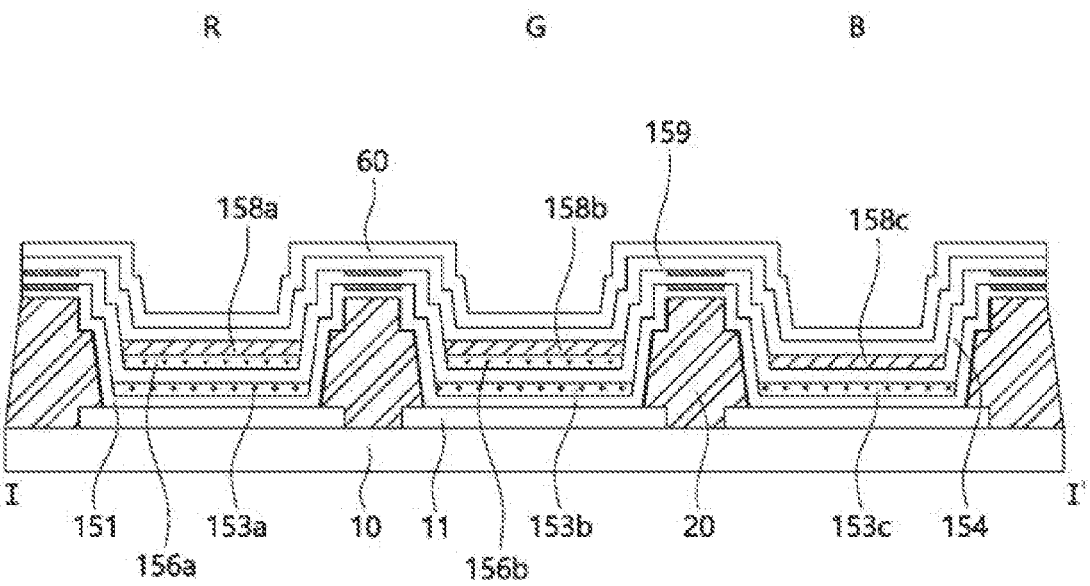

As illustrated in FIG. 19M, a fifth organic material layer 159 can be formed on a whole surface of the substrate 10 with the red emission layer 137a, the green emission layer 137b, and the blue emission layer 137c formed thereon by using a deposition process.

The fifth organic material layer 159 can include the second electron transport layer (ETL2) and the electron injection layer (EIL) illustrated in FIG. 17. Therefore, in FIG. 19M, the fifth organic material layer 159 is illustrated as a single layer, but is not limited thereto and can be formed of a multilayer.

Moreover, a second electrode 60 can be formed on the substrate 10 with the fifth organic material layer 159 formed thereon by using a deposition process.

Furthermore, in the manufacturing method according to the fifth embodiment of the present disclosure, when a pile-up effect is considered, a process on the third hole transport layers 156a and 156b described above with reference to FIGS. 19I and 19J can be removed.

As discussed above, an organic light emitting display panel can include a first electrode disposed in each of a plurality of subpixel areas of a substrate; and a second electrode. In this context, at least one deposition layer can be on the first electrode, and be hydrophobic, while at least one soluble layer can be on the at least one deposition layer. Additionally, a plurality of bank layers can be on the substrate, and have a portion being hydrophobic. To make the organic light emitting display panel, a method of making can include forming a first electrode in each of a plurality of subpixel areas of a substrate, forming a plurality of bank layers at a boundary portion between adjacent subpixel areas of the plurality of subpixel areas on the substrate, performing at least one treatment process on a surface of a layer to provide hydrophilicity or hydrophobicity to the layer; and forming at least one organic layer on the first electrode. The at least one treatment process can include one or more plasma treatment processes, and forming of at least one organic layers can include various organic layers discussed in embodiments of the present invention, as well as a deposition layer and/or a soluble layer.

As described above, in the method of manufacturing the organic light emitting display panel according to an embodiment of the present disclosure, an emission layer can be configured with a multi-stack by performing a deposition process and an inkjet printing process a plurality of times, and thus, an emission characteristic of a light emitting device can be enhanced.

Moreover, according to the second, fourth, and fifth embodiments, a light emitting device can be formed by performing a deposition process and an inkjet printing process, and thus, a pile-up effect can be removed.

A method of manufacturing an organic light emitting display panel according to the present disclosure can have the following effects.

First, because a bank structure is formed of a single layer, a manufacturing process can be simplified, and an organic residual layer on a first electrode can be removed.

Second, a light emitting device can be formed by performing a deposition process and an inkjet printing process, and thus, a material of each light emitting layer can be variously selected.

Third, the light emitting layer can be formed of a multi-stack by performing the deposition process and the inkjet printing process a plurality of times, and thus, an emission characteristic of the light emitting device can be enhanced.

Fourth, in the present disclosure, because the light emitting device is manufactured by performing the deposition process and the inkjet printing process, pile-up can be reduced.

The effects according to the present disclosure are not limited to the above examples, and other various effects can be included in the specification.

While the present disclosure has been particularly shown and described with reference to exemplary embodiments thereof, it will be understood by those of ordinary skill in the art that various changes in form and details can be made therein without departing from the spirit and scope of the present disclosure as defined by the following claims.

What is claimed is:

1. An organic light emitting display panel comprising:
a first electrode disposed in each of a plurality of subpixel areas of a substrate;
a second electrode;
at least one deposition layer on the first electrode;
at least one soluble layer on the at least one deposition layer; and
a plurality of bank layers on the substrate,
wherein the plurality of bank layers are disposed on the substrate at a boundary portion between adjacent subpixel areas of the plurality of subpixel areas, at least a lateral surface of the plurality of bank layers being hydrophilic, and
wherein the at least one deposition layer includes a first deposition layer including a first organic material layer disposed on the plurality of bank layers and the first electrode, a surface of the first organic material layer on the plurality of bank layers being hydrophobic.

2. The organic light emitting display panel of claim 1, wherein the at least one soluble layer includes a first soluble layer including a second organic material layer disposed on the first organic material layer between adjacent bank layers of the plurality of bank layers,
wherein the at least one deposition layer further includes a second deposition layer including a third organic material layer disposed on the second organic material layer and the first organic material layer, and
wherein the second electrode is disposed on the third organic material layer.

3. The organic light emitting display panel of claim 2, wherein the first organic material layer comprises at least one of a hole injection layer and a hole transport layer,
wherein the second organic material layer comprises an emission layer, and
wherein the third organic material layer comprises at least one of an electron transport layer and an electron injection layer.

4. The organic light emitting display panel of claim 2, wherein the plurality of subpixel areas including red, green, and blue subpixel areas that are defined in the substrate,
wherein the first organic material layer is disposed on the first electrode and on a top surface and the lateral surface of the plurality of bank layers, a top surface of the first organic material layer on the plurality of bank layers being hydrophobic,
wherein the at least one soluble layer further includes a second soluble layer including a fourth organic material layer disposed between the second organic material layer and the first organic material layer, and
wherein the fourth organic material layer is disposed on only the first organic material layer of the red subpixel area and the green subpixel area between adjacent bank layers.

5. The organic light emitting display panel of claim 4, wherein the first organic material layer comprises at least one of a hole injection layer and a first hole transport layer,
wherein the second organic material layer comprises an emission layer,
wherein the third organic material layer comprises at least one of an electron transport layer and an electron injection layer, and
wherein the fourth organic material layer comprises a second hole transport layer.

6. The organic light emitting display panel of claim 2, wherein the plurality of subpixel areas including red, green, and blue subpixel areas are defined in the substrate,
wherein the at least one soluble layer further includes a second soluble layer including a fourth organic material layer and a third soluble layer including a fifth organic material layer which are disposed on the second deposition layer between adjacent bank layers of the plurality of bank layers,
wherein the at least one deposition layer further includes a third deposition layer including a sixth organic material layer disposed on the third soluble layer and the second deposition layer,
wherein a surface of the third organic material layer on the plurality of bank layers being hydrophobic,
wherein the second electrode is disposed on the sixth organic material layer, and
wherein the fourth organic material layer comprises a first hole transport layer disposed on only the second deposition layer of the red subpixel area and the green subpixel area between adjacent bank layers of the plurality of bank layers, and the fifth organic material layer comprises a first emission layer disposed in the red subpixel area, the green subpixel area, and the blue subpixel area.

7. The organic light emitting display panel of claim 6, wherein the first organic material layer comprises a second hole transport layer, wherein the second organic material layer comprises a first emission layer, wherein the third organic material layer comprises a first electron transport layer, an n-type charge generating layer, a p-type charge generating layer, and a second hole transport layer, and wherein the sixth organic material layer comprises a second electron transport layer and an electron injection layer.

* * * * *